(12) United States Patent
Lu et al.

(10) Patent No.: US 8,466,062 B2
(45) Date of Patent: Jun. 18, 2013

(54) TSV BACKSIDE PROCESSING USING COPPER DAMASCENE INTERCONNECT TECHNOLOGY

(75) Inventors: Yue Kang Lu, Singapore (SG);
Shaoning Yuan, Singapore (SG); Yeow Kheng Lim, Singapore (SG); Juan Boon Tan, Singapore (SG)

(73) Assignee: GLOBALFOUNDRIES Singapore PTE Ltd, Singapore (SG)

( * ) Notice: Subject to any disclaimer, the term of this patent is extended or adjusted under 35 U.S.C. 154(b) by 0 days.

(21) Appl. No.: 13/287,220

(22) Filed: Nov. 2, 2011

(65) Prior Publication Data

US 2013/0105968 A1    May 2, 2013

(51) Int. Cl.
*H01L 21/44* (2006.01)
(52) U.S. Cl.
USPC ............ 438/667; 257/E21.577; 257/E21.585; 438/612; 438/618; 438/666; 438/672
(58) Field of Classification Search
USPC .................. 257/E21.577, E21.585; 438/612, 438/618, 666, 667, 672
See application file for complete search history.

(56) References Cited

U.S. PATENT DOCUMENTS 6,551,856 B1    4/2003  Lee
2004/0018712 A1*  1/2004  Plas et al. ...................... 438/612

OTHER PUBLICATIONS

Puech et al., "DRIE achievements for TSV covering Via First and Via Last Strategies," Alcatel Micro Machining Systems, France.

* cited by examiner

*Primary Examiner* — Asok K Sarkar
(74) *Attorney, Agent, or Firm* — Williams, Morgan & Amerson, P.C.

(57) ABSTRACT

Generally, the subject matter disclosed herein relates to interconnect structures used for making electrical connections between semiconductor chips in a stacked or 3D chip configuration, and methods for forming the same. One illustrative method disclosed herein includes forming a conductive via element in a semiconductor substrate, wherein the conductive via element is formed from a front side of the semiconductor substrate so as to initially extend a partial distance through the semiconductor substrate. The illustrative method also includes forming a via opening in a back side of the semiconductor substrate to expose a surface of the conductive via element, and filling the via opening with a layer of conductive contact material.

32 Claims, 15 Drawing Sheets

TSV BACKSIDE PROCESSING USING COPPER DAMASCENE INTERCONNECT TECHNOLOGY

BACKGROUND

1. Field of the Disclosure

Generally, the present disclosure relates to sophisticated integrated circuits, and, more particularly, manufacturing methods for back side processing of through-silicon vias (TSV's) and the resulting interconnect structures.

2. Description of the Related Art

In recent years, the device features of modern, ultra-high density integrated circuits have been steadily decreasing in size in an effort to enhance the overall speed, performance, and functionality of the circuit. As a result, the semiconductor industry has experience tremendous growth due to the significant and ongoing improvements in integration density of a variety of electronic components, such as transistors, capacitors, diodes, and the like. These improvements have primarily come about due to a persistent and successful effort to reduce the critical dimension—i.e., minimum feature size—of components, directly resulting in the ability of process designers to integrate more and more components into a given area of a semiconductor chip.

Improvements in integrated circuit design have been essentially two-dimensional (2D)—that is, the improvements have been related primarily to the layout of the circuit on the surface of a semiconductor chip. However, as device features are being aggressively scaled, and more semiconductor components are being fit onto the surface of a single chip, the required number of electrical interconnects necessary for circuit functionality dramatically increases, resulting in an overall circuit layout that is increasingly becoming more complex and more densely packed. Furthermore, even though improvements in photolithography processes have yielded significant increases in the integration densities of 2D circuit designs, simple reduction in feature size is rapidly approaching the limit of what can presently be achieved in only two dimensions.

As the number of electronic devices on single chip rapidly increases, three-dimensional (3D) integrated circuit layouts, or stacked chip design, have been utilized for some semiconductor devices in an effort to overcome some of the feature size and density limitations associated with 2D layouts. Typically, in a 3D integrated circuit design, two or more semiconductor chips are bonded together, and electrical connections are formed between each chip. One method of facilitating the chip-to-chip electrical connections is by use of so-called through-silicon vias, or TSV's. A TSV is a vertical electrical connection element that passes completely through a silicon wafer or die, allowing for more simplified interconnection of vertically aligned electronic devices, thereby significantly reducing integrated circuit layout complexity, as well as the overall dimensions of a multi-chip circuit. Some of the benefits associated with the interconnect technology enabled by 3D integrated circuit designs include accelerated data exchange, reduced power consumption, and much higher input/output voltage densities.

Currently, most integration development has tended to focus on forming TSV's within an active area of the semiconductor die—e.g., via-middle and via-last schemes. However, irrespective of the integration scheme utilized, in most state-of-the-art TSV processing, through-silicon vias are typically formed in a wafer from the front side. The back side of the wafer is then processed so as to expose the TSV's, and interconnect structures are formed to facilitate electrical connections to another semiconductor chip during a chip packaging operation. A typical prior art process for the back side processing of TSV's is illustrated in FIGS. 1a-1g, and will now be described in detail below.

FIG. 1a is a schematic cross-sectional view depicting an early stage of a back side TSV processing operation in accordance with an illustrative prior art process. As shown in FIG. 1a, a semiconductor chip or wafer 100 is in a "flipped" position—i.e., with a back side 100b oriented up for the back side processing operations, and a front side 100f oriented down. The wafer 100 may comprise a substrate 101, which may represent any appropriate carrier material, such as silicon or silicon-based materials, and the like. Additionally, the wafer 100 may include a semiconductor layer 102 that may be made up of active areas (not shown) in which a plurality of schematically depicted active and/or passive circuit elements 103, such as transistors, capacitors, resistors and the like may be formed, in which case the semiconductor layer 102 may also be referred to as a device layer 102. Depending on the overall design strategy employed for the wafer 100, the substrate 101 may in some cases be a substantially crystalline substrate material (i.e., bulk silicon), whereas in other instances the 10substrate 101 may be formed on the basis of a silicon-on-insulator (SOI) architecture, in which a buried insulating layer (not shown) may be provided between the device layer 102 and the substrate 101. It should be appreciated that the semiconductor/device layer 102, even if comprising a substantially silicon-based material layer, may include other semiconducting materials, such as germanium, carbon and the like, in addition to appropriate dopant species for establishing the requisite active region conductivity type for the circuit elements 103.

The wafer 100 shown in FIG. 1a also illustrates a contact structure layer 104, which may be formed between the device layer 102 and a metallization system 105, where various conductive lines and contact vias (not shown) are formed to define a circuit layout, so as to provide electrical interconnects between the circuit elements 103 and the metallization system 105. The typical processing steps and materials used to form the circuit elements 103 in the device layer 102, the contact layer 104, and the metallization system 105 are well known in the art, and will not be further discussed.

The illustrative wafer 100 of FIG. 1a may also include one or more through-silicon vias (TSV's) 106 for facilitating electrical connections between two or more stacked chips, as previously described. Typically, during initial processing of the wafer 100 from the front side 100f, the TSV's 106 are only formed a partial distance through the substrate 101, such that the TSV's 106 extend to a depth 106d, and come to within a distance 106e of the back side 100b. For example, depending on the various processing parameters, such as the depth 106d, the material of the substrate 101, the width 106w of the TSV's 106, and the like, the sidewalls of the TSV's 106 may be slightly tapered, as shown in FIG. 1a, or they may be substantially vertical with respect to the front and back sides 100f, 100b. In some cases, the TSV's 106 may typically be made up of a suitable conductive material, such as copper or copper-based alloys, and may have an average width 106w ranging between approximately 1 µm and 10 µm. In some typical devices, the depth 106d of the TSV's 106 may range from approximately 40-60 µm, although in other devices the depth 106d may be less than 40 µm or greater than 60 µm, depending on the overall device design and processing parameters. Furthermore, and in some cases depending on the overall type of back side integration, the distance 106e may range between approximately 1 µm and 20 µm after the completion of an initial back side thinning or grinding operation.

A liner 107 may be positioned between the TSV 106 and the substrate 101 so as to electrically isolate the TSV 106, and in some cases, to substantially prevent the material of the TSV 106 from diffusing into the substrate 101, a situation which could create undesirable conducting paths in the circuit, and potentially lead to a commensurate degradation in overall device performance. The material of the liner 107 may have a thickness in the range of 100-200 nm, and may be made up any suitable insulating dielectric material, such as silicon dioxide, silicon nitride, silicon oxynitride, and the like. Additionally, in some cases a diffusion barrier layer (not shown) may be formed between the liner 107 and the TSV's 106 so as to prevent the material of the TSV's 106 for diffusing into and/or through the liner 107 and into the substrate 101, the device layer 102, or the contact structure layer 104.

As shown in FIG. 1*a*, during back side TSV processing, the wafer 100 may be exposed to an initial etch back process 121 that is adapted to selectively remove a portion 101*t* of the substrate 101 in preparation for exposing the copper or copper alloy material of the TSV's 106. For example, in some instances, the etch back process 121 may be an appropriately designed isotropic wet or dry etch process, based on a recipe that selectively removes a silicon-containing semiconductor material of the substrate 101 relative to a silicon dioxide material of the liner 107, such as a combination of hydrofluoric (HF) and nitric ($HNO_3$) acids and the like. Other recipes well known in the art may also be used.

FIG. 1*b* shows the illustrative wafer 100 after completion of the etch back process 121, and where the portion 101*t* of the substrate 101 has been etched away. Thereafter, a deposition process 122 may be performed so as to form a dielectric protection layer 108 above the exposed surfaces of the back side 100*b* of the wafer 100, so as to protect the material of the substrate 101 during subsequent processing steps, as will be described more fully below. Depending on the overall device processing requirements, the dielectric protection layer 108 may be any suitable dielectric material, such as silicon dioxide, silicon nitride, silicon oxynitride, silicon carbonitride, and the like.

As shown in FIG. 1*c*, the wafer 100 may then be subjected to planarization process 123, which may be, for example, a chemical mechanical polishing (CMP) process and the like, so as to planarize the back side 100*b* of the wafer 100, and to expose a surface 106*s* of the material of the TSV's 106 for further processing. Due to the various different types of materials that may be encountered during the planarization, or CMP, process 123—i.e., the dielectric protection layer 108, the liner 107, and the TSV 106—the CMP process 123 may be designed to include multiple consecutive planarizing steps, where the CMP recipe used for each individual planarizing step may be appropriately tailored and/or adjusted to the specific combination of materials being planarized.

FIG. 1*d* schematically illustrates the wafer 100 of FIG. 1*c* after completion of the CMP process 123. As noted above, the dielectric protection layer 108 may serve to protect the back side 100*b* of the wafer 100 during the final stages of the CMP process 123. For example, depending on the specific processing parameter, the material that makes up the TSV's 106 may tend to smear across the planarized back side surface 100*s* of the wafer 100 during the CMP process 123. For example, in those instances where the TSV's are made up of copper and/or copper alloy materials and the substrate 101 is made up of silicon and/or silicon-based materials, the copper-based material of the TSV's 106 may contaminate, and diffuse into, the silicon-based material of the substrate 101. However, with the dielectric protection layer 108 present above the back side 100*b* of the wafer 100, any material of the TSV's 106 that smears during the CMP process 123 will remain on the surface 100*s* the presence of the dielectric protection layer 108 may serve to substantially prevent such contamination and/or diffusion from occurring, thereby potentially avoided the subsequent device degradation, as previously described. Accordingly, as shown in FIG. 1*d*, portions of the dielectric protection layer 108 may be left in place above the exposed areas of the substrate 101 throughout the CMP process 123, thereby protecting and isolating the substrate 101 during the CMP process 123, as well as during further processing steps, as described below.

Also as shown in FIG. 1*d*, a material deposition process 124 may be performed so as to form a conductive material layer 110 above the planarized back side surface 100*s* in preparation for forming contact structures, as is more fully described below. In some cases the conductive material layer 110 may be formed so as to be in electrical contact with the TSV's 106, although in some cases an intervening barrier and/or adhesion layer (not shown) may be formed between the conductive material layer 110 and the TSV's 106. Depending on the desired overall process flow, the conductive material layer 110 may be, for example, an aluminum-based metal layer, as may typically be used in some applications to form contact pads 110*p* (see, FIG. 1 *e*) for bump structures 112 (see, FIG. 1*f*).

FIG. 1*e* schematically depicts the illustrative wafer 100 of FIG. 1*d* during a further processing stage, after the aluminum-based conductive material layer 110 has been formed above the planarized back side surface 100*s*. As shown in FIG. 1*e*, a patterned etch mask layer 130, such as, for example, a patterned photoresist mask, may be formed above the conductive material layer 110. Thereafter, the back side 100*b* of the wafer 100 may be exposed to a suitably designed anisotropic etch process 125 so as to form contact pads 110*p* above portions of the dielectric protection layer 108 and each TSV 106 (see, FIG. 1*f*). The anisotropic etch process 125 may be adapted to selectively remove material of the conductive material layer 110 relative to the dielectric protection layer 108, recipes for which are well known in the art.

FIG. 1*f* schematically illustrates the wafer 100 of FIG. 1*e* in a subsequent processing stage, after the contact pads 110*p* have been formed, the patterned etch mask layer 130 has been removed, and a passivation layer 111 has been formed above the back side 100*b* of the wafer 100. As shown in FIG. 1*f*, the passivation layer 111 completely encloses each contact pad 110*p*, and furthermore extends above an upper surface 110*s* of each contact pad 110*p*, thereby substantially electrically isolating the respective contact pads 110*p*. Depending on the processing requirements, the passivation layer 111 may be a silicon-based dielectric material, such as silicon nitride, or an organic polymer material, such as a polyimide and the like. A second patterned etch mask 131 may then be formed above the passivation layer 111, and the back side 100*b* of the wafer 100 may be exposed to a suitable dry anisotropic etch process 126, such as a reactive ion etch (RIE) process and the like, so as to form openings 111*a* that expose a portion of the upper surfaces 110*s* of each contact pad 110*p*.

FIG. 1*g* schematically illustrates the wafer 100 in a further advance manufacturing stage, after the second patterned etch mask 131 has been removed from above the passivation layer 111. Furthermore, completed interconnect structures 150 have been formed on the back side 100*b* of the wafer 100, which may be used to affect an electrical connection between the various stacked chips of a representative chip package. Each of the interconnect structures 150 may include, for example, a contact pad 110*p* that is in electrical contact with a TSV 106, and a bump structure 112 that has been formed in and above the openings 111a (see, FIG. 1f) so as to electrically contact the exposed portions of the upper surfaces 110s of the contact pads 110p. As shown in FIG. 1g, each bump structure 112 may include an underbump metallization (UBM) layer 112u and a solder ball 112b. The various processing steps used for forming the bump structures 112 shown in FIG. 1g are well known in the semiconductor processing arts, and are therefore not described herein.

As noted, the interconnect structures 150 may be used to facilitate making the electrical connections that are required between one semiconductor chip and another in a stacked or 3D chip configuration. However, the above described process may impose some limitations on the overall layout of a given chip, and consequently, on the 3D circuit designs. For example, aluminum-based metal contact pads 110p are typically only formed directly above a TSV 106, and as such the locations of the contact pads 110p will be dictated by the specific locations of the TSV's 106. However, the specific locations of the TSV's 106 may be dictated by other chip layout criteria that may not conform to the most desirable layout for the bump structures 112, which would typically be based on a substantially uniform spacing and layout. In such cases, redistribution layers (RDL) are used to "relocate" secondary bond pads to more desirable, uniformly spaced positions on the back side 100b of the wafer 100. For most applications utilizing aluminum-based contact pads 110p, RDL process integration commonly requires additional processing steps to form patterned metal lines and additional passivation and/or insulating layers, thus increasing the overall integration complexity and cost.

Accordingly, there is a need to implement new design strategies to address the manufacturing and performance issues associated with the prior art methods that have commonly been used for performing back side TSV processing. The present disclosure relates to methods and structures for avoiding, or at least reducing, the effects of one or more of the problems identified above.

SUMMARY OF THE DISCLOSURE

The following presents a simplified summary of the present disclosure in order to provide a basic understanding of some aspects disclosed herein. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the subject matter disclosed herein relates to interconnect structures used for making electrical connections between semiconductor chips in a stacked or 3D chip configuration, and methods for forming the same. One illustrative method disclosed herein includes forming a conductive via element in a semiconductor substrate, wherein the conductive via element is formed from a front side of the semiconductor substrate so as to initially extend a partial distance through the semiconductor substrate. The illustrative method also includes forming via opening in a back side of the semiconductor substrate to expose a surface of the conductive via element, and filling the via opening with a layer of conductive contact material.

Another illustrative embodiment of the present disclosure is a method that includes, among other things, forming a conductive via element in a semiconductor substrate, wherein the conductive via element is formed from a front side of and extends partially through the semiconductor substrate, and forming an interconnect structure that is electrically connected to the conductive via element, wherein the interconnect structure is formed from a back side of and extends partially through the semiconductor substrate.

In yet another illustrative embodiment, a method is disclosed that includes forming a via opening in a back side of a semiconductor substrate, the via opening exposing a surface of a conductive via element that initially extends a partial distance through the semiconductor substrate from a front side thereof, and forming a conductive contact plug in the via opening, wherein the conductive contact plug is in electrical contact with the conductive via element. The method also includes forming a trench opening above the via opening, and forming a metal line in the trench opening.

Also disclosed herein is an illustrative semiconductor device that includes, among other things, a first conductive via element extending a first partial depth into a semiconductor substrate from a front side thereof, wherein the first conductive via element has a first surface portion at a first end proximate the front side. The disclosed semiconductor device further includes a second conductive via element extending a second partial depth into said semiconductor substrate from a back side thereof, wherein the second conductive via element has a second surface portion at a second end proximate to the back side, and wherein the first conductive via element is electrically connected to the second conductive via element.

BRIEF DESCRIPTION OF THE DRAWINGS

The disclosure may be understood by reference to the following description taken in conjunction with the accompanying drawings, in which like reference numerals identify like elements, and in which.

Figure 1A:
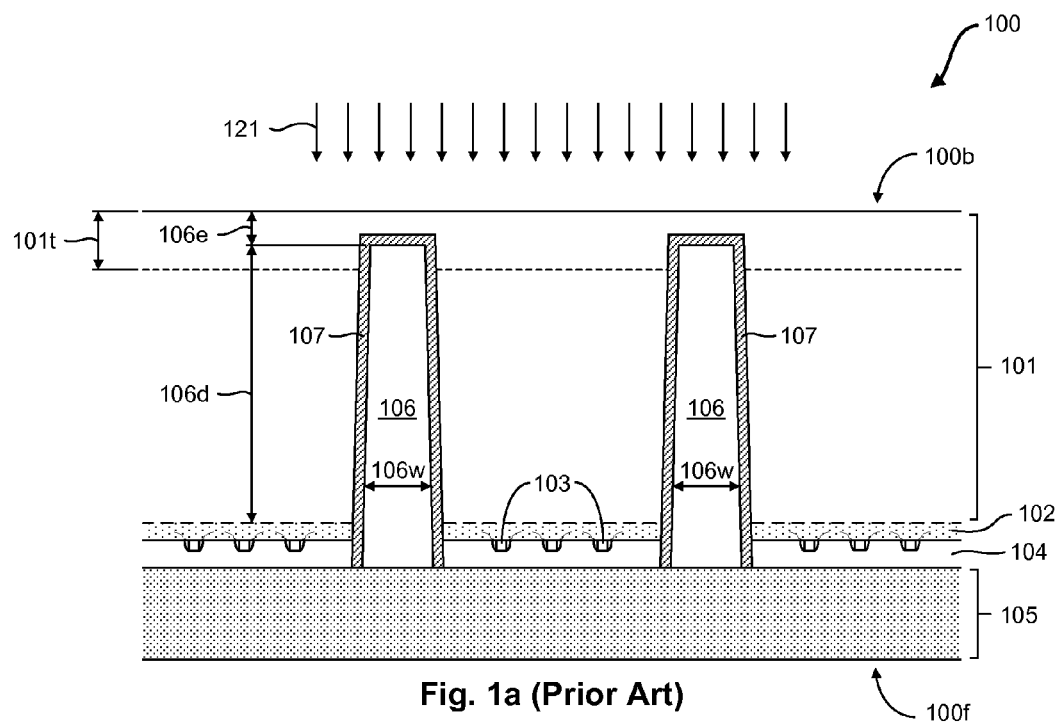
FIGS. 1a-1g schematically illustrate a process flow of an illustrative prior art method used to perform back side processing of TSV's formed in a semiconductor wafer.
Figure 1B:
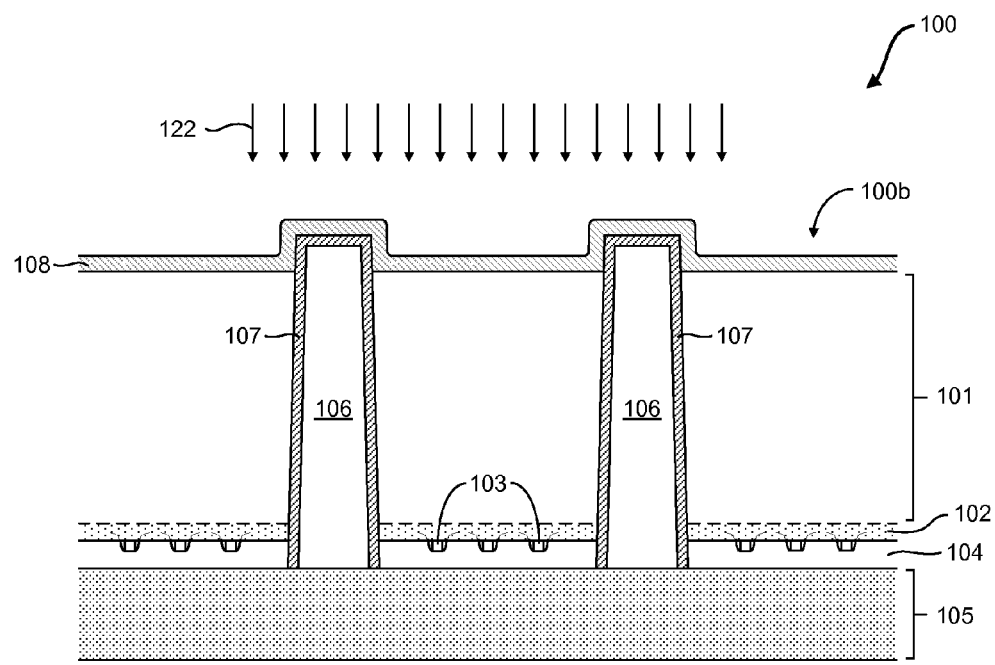
Figure 1C:
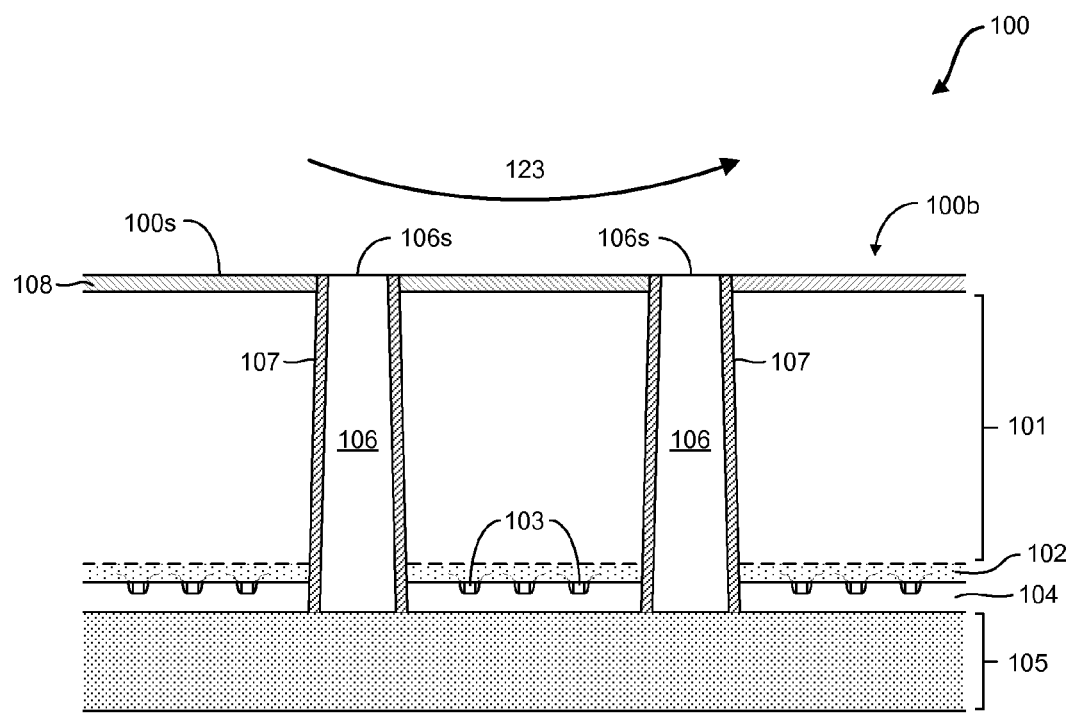
Figure 1D:
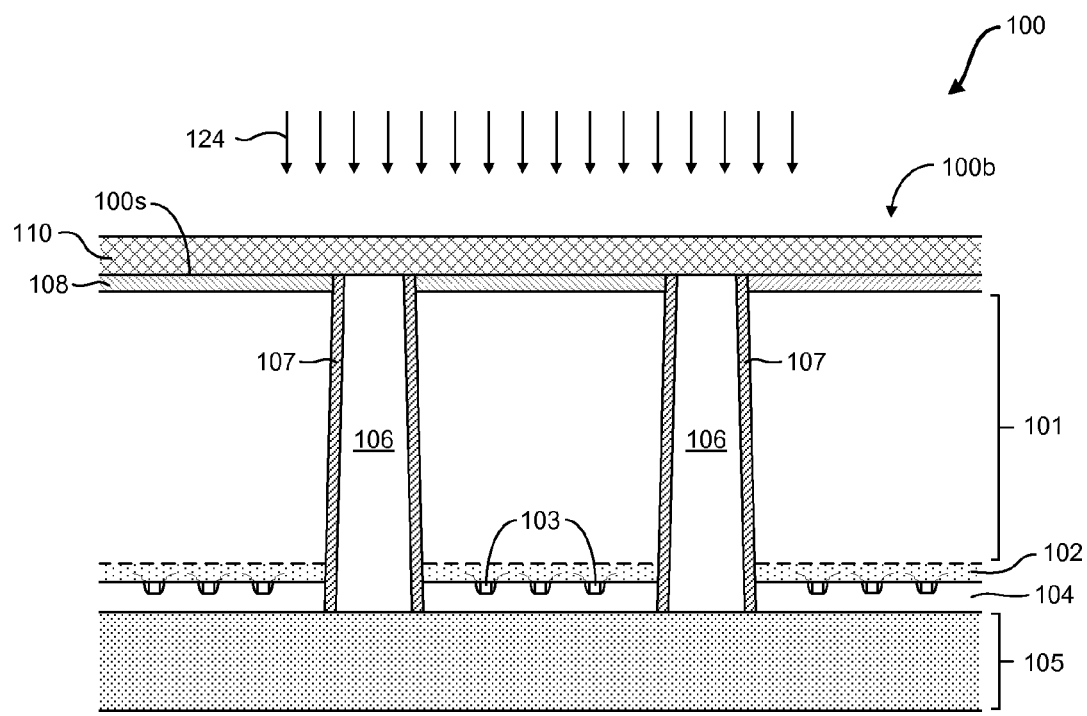
Figure 1E:
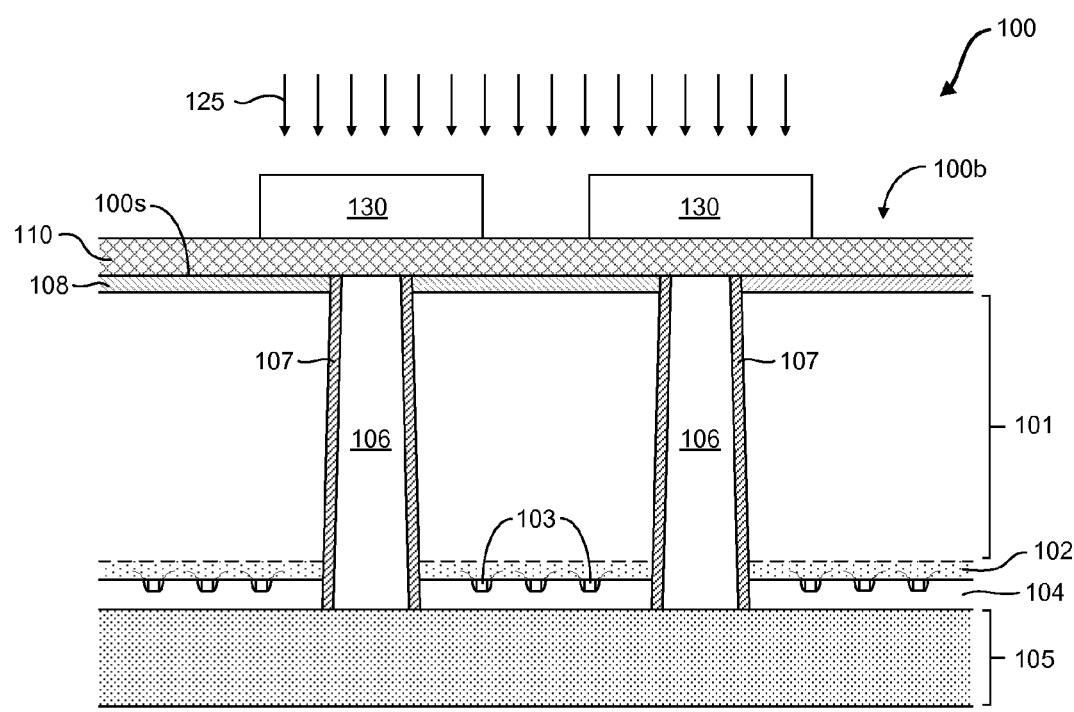
Figure 1F:
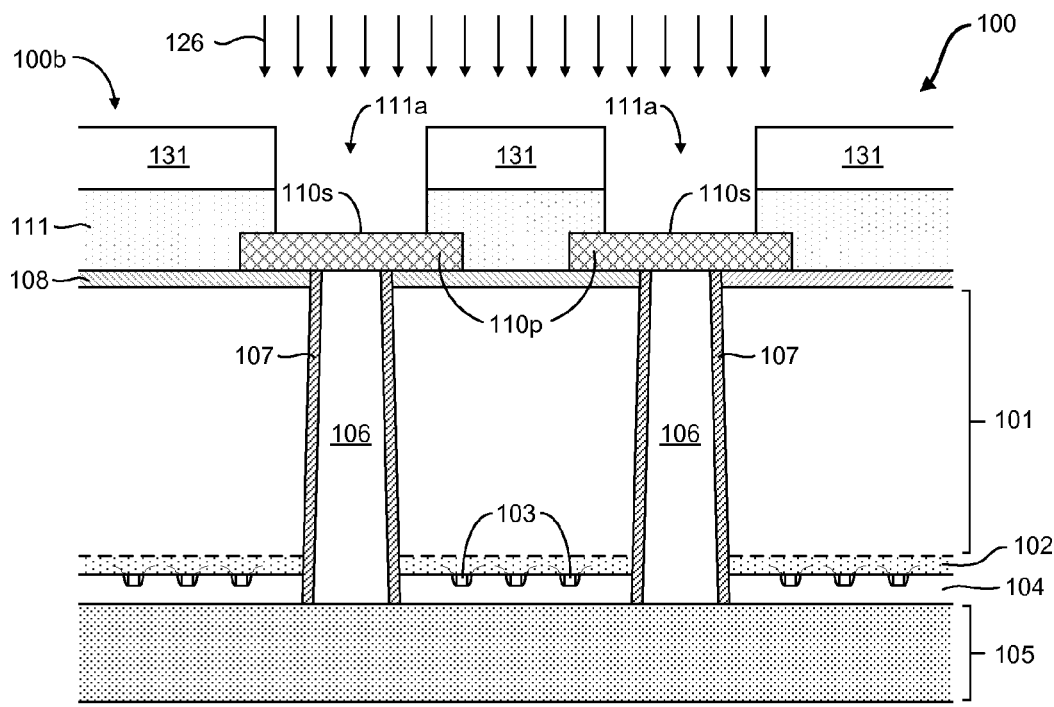

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides various novel manufacturing techniques for processing the back side of a semiconductor chip or wafer based on a copper damascene or dual-damascene approach so as to form interconnect structures for electrically connecting one semiconductor chip to another semiconductor chip in a stacked or 3D chip package, as well as the structures resulting from these novel techniques. Historically, and in part due to the relatively simple processing requirements, aluminum and aluminum-based metal alloys have been used to form the various conductive elements making up a typical semiconductor device circuit, such as contact vias, conductive lines, contact pads, and the like. Typically, aluminum-based conductive elements are formed by depositing a layer of aluminum or an aluminum-based alloy over a region, or even an entire surface, of a wafer. The aluminum material layer is then patterned by using a plasma-based anisotropic etch process, such as reactive ion etching (RIE) to remove those portions of the aluminum layer that do not make up conductive element. The spaces between the conductive elements that are created by the etch process are then filled in with a suitable dielectric insulating material so as to electrically isolate each of the conductive elements.

Due to their superior electrical and thermal conductivity, as well as their greater resistance to electromigration, copper and copper-based metal alloys have increasing become the materials of choice for forming conductive elements in advance semiconductor devices. However, due to the lack of volatile copper compounds, it is significantly more difficult to pattern a copper material layer based on the plasma etch techniques commonly used for aluminum-based materials. Accordingly, the so-called "damascene" technique is generally used for forming copper-based conductive circuit elements.

In the copper damascene technique, a dielectric insulating material layer is first deposited above a substrate, and the dielectric layer is then patterned to form openings, such as vias or trenches, that correspond to the various conductive elements to be formed in the dielectric layer. A suitable deposition process, such as an electrochemical deposition process and the like, is then used to fill the openings with a copper-based conductive material. In the dual-damascene approach, interconnected openings for both conductive lines (i.e., trench openings) and contact vias (i.e., via openings) are formed in the same dielectric layer, and thereafter filled in a common material deposition step. The present disclosure is directed to, among other things, utilizing the damascene and dual-damascene techniques for forming interconnect structures that are used to facilitate the make-up of electrical connections between the various semiconductor chips of a stacked or 3D chip package.

It should be noted that, where appropriate, the reference numbers used in describing the various elements shown in the illustrative embodiments of FIGS. 2a-2h and FIGS. 3a-3j substantially correspond, where appropriate to the reference numbers used in describing related elements illustrated in FIGS. 1a-1g above, except that the leading numeral in each figure has been changed from a "1" to a "2" or a "3," as applicable. For example, wafer "100" corresponds to wafer "200" and wafer "300," substrate "101" corresponds to substrate "201" and substrate "301," passivation layer "108" corresponds to passivation layers "208" and "308," and so on. Accordingly, the reference number designations used to identify some elements of the presently disclosed subject matter may be illustrated in the FIGS. 2a-2h and FIGS. 3a-3j but may not be specifically described in the following disclosure. In those instances, it should be understood that the numbered elements shown in FIGS. 2a-2h and FIGS. 3a-3j which are not described in detail below substantially correspond with their like-numbered counterparts illustrated in FIGS. 1a-1g, and described in the associated disclosure set forth above.

Furthermore, it should be understood that, unless otherwise specifically indicated, any relative positional or directional terms that may be used in the descriptions below—such as "upper," "lower," "above," "below," "over," "under," "top," "bottom," "vertical," "horizontal," and the like—should be construed in light of that term's normal and everyday meaning relative to the depiction of the components or elements in the referenced figures. However, it should be noted that, since each of the wafers 100, 200 and 300 illustrated in the various figures are depicted in a "flipped" position—i.e., with the back sides 100b, 200b and 300b oriented up for the back side processing operations—the relative positional and directional terms used herein are based on the "flipped" orientation of the wafers 100, 200 and 300 as shown in the figures.

For example, referring to the schematic cross-section of the semiconductor wafer 100 depicted in FIG. 1g, it should be understood that the passivation layer 111 is positioned "above" the dielectric protection layer 108 and the substrate 101, and the TSV's 106 are positioned "below" the contact pads 110p. Additionally, the term "vertical" should be understood as being substantially perpendicular to the back side 100b of the wafer 100, whereas the term "horizontal" should understood as being substantially parallel to the back side 100b.

FIGS. 2a-2h, which schematically illustrate the various steps in a process flow for performing back side processing of TSV's based on a single damascene technique, are described in detail below.

Figure 1G:
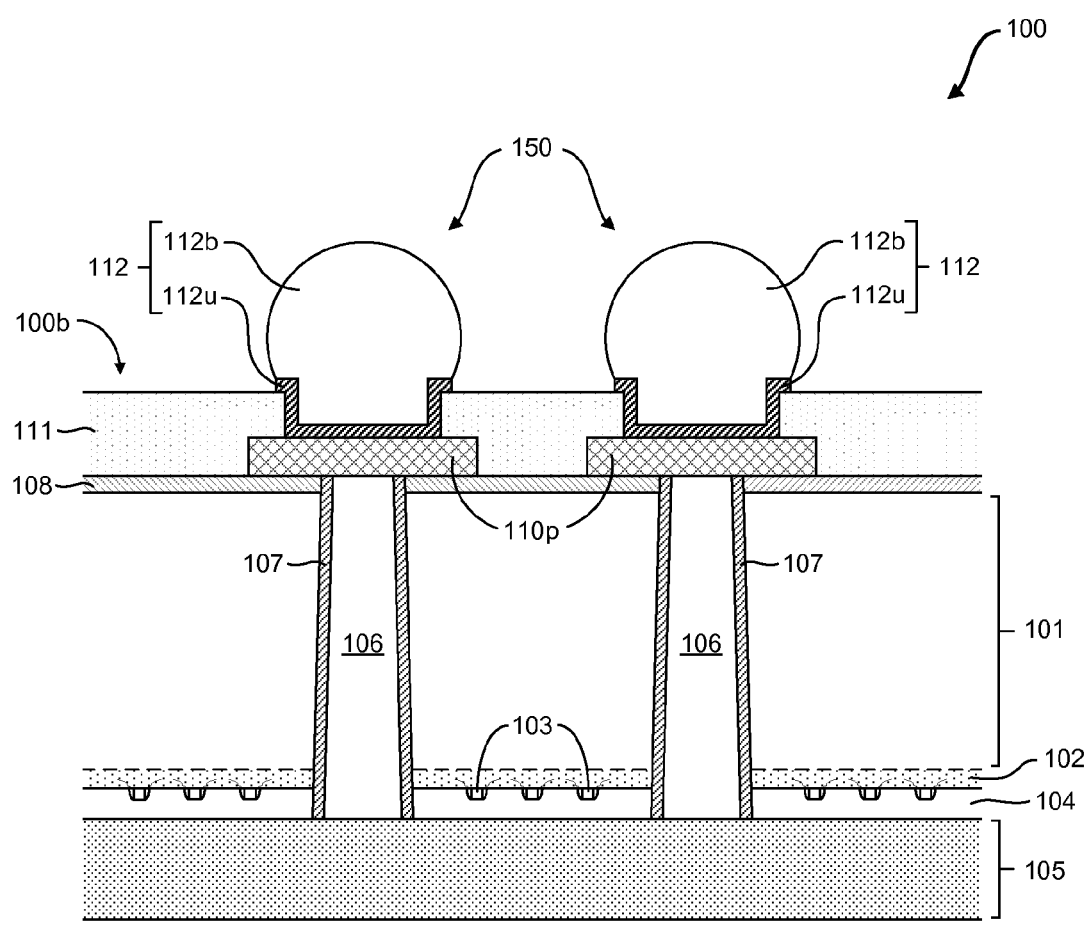
Figure 2A:
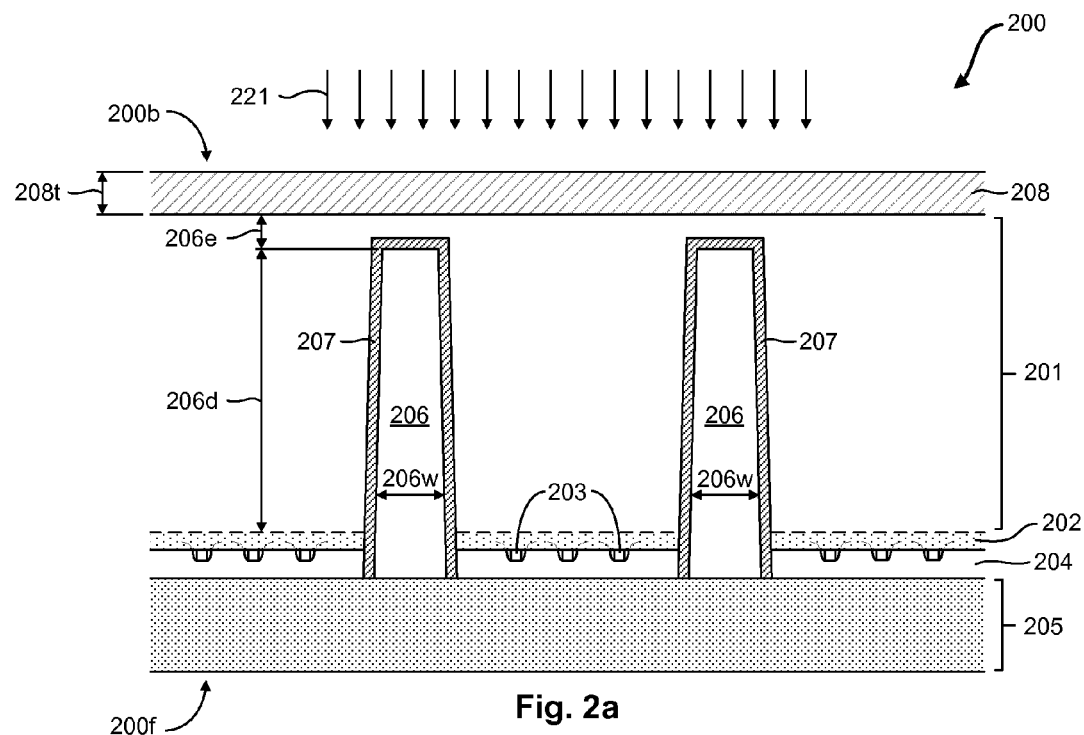
FIGS. 2a-2h schematically illustrate a process flow for performing back side processing of TSV's in accordance with one illustrative embodiment of the present disclosure based on a single damascene technique.

FIG. 2a shows a schematic cross-sectional view of an illustrative semiconductor wafer 200 that substantially corresponds to the wafer 100 illustrated in FIG. 1a and described above. As with the wafer 100, and depending on the overall device requirements, the wafer 200 may be made up of a substrate 201, a device layer 202 that may include a plurality of circuit elements 203, a contact structure layer 204, and a metallization system 205. Furthermore, the wafer 200 may also include one or more TSV's 206, which may be electrically isolated and separated from the substrate 201 by a liner 207. Additionally, in some embodiments, a barrier diffusion layer (not shown) may be formed between the TSV's 206 and the liner 207. Depending on the overall processing scheme, the TSV's 206 may extend to a depth 206d into the substrate 201, and come to within a distance 206e of the back side 200b of the wafer 200. In at least some illustrative embodiments, the wafer 200 may include a plurality of dies or chips, which may be separated in a dicing operation during a later stage of device manufacturing. It should be noted that, depending on the overall device requirements, the materials making up each of the above-listed elements of the wafer 200 shown in FIG. 2a may substantially correspond to the materials previously noted with respect to the wafer 100, and therefore will not described here in any further detail.

In some illustrative embodiments, a dielectric protection layer 208 may be formed above the back side 200b of the wafer 200, so as to substantially protect the material of the substrate 201 during back side processing activities. In certain embodiments, the dielectric protection layer 208 may be any one of several suitable dielectric materials, including silicon-based dielectrics such as silicon dioxide, silicon nitride, silicon oxynitride, and the like. The thickness 208t of the dielectric protection layer 208 may selected as required to withstand the deleterious effects of the anticipated back side processing steps, so as to ensure that the substrate 201 remains substantially protected. For example, in at least some embodiments, the thickness 208t of the dielectric protection layer 208 may range on the order of approximately 100-500 nm like, while thicker layers, or even thinner layers, may also be used, depending on the ultimate device processing requirements.

As shown in FIG. 2a, the dielectric protection layer 208 may be formed above the back side 200b by performing a suitably designed deposition process 221, recipes for which are known in the art. For example, depending on the desired material composition of the dielectric protection layer 208, the deposition process 221 may be a chemical vapor deposition (CVD) process, although other processes may also be used.

Figure 2B:
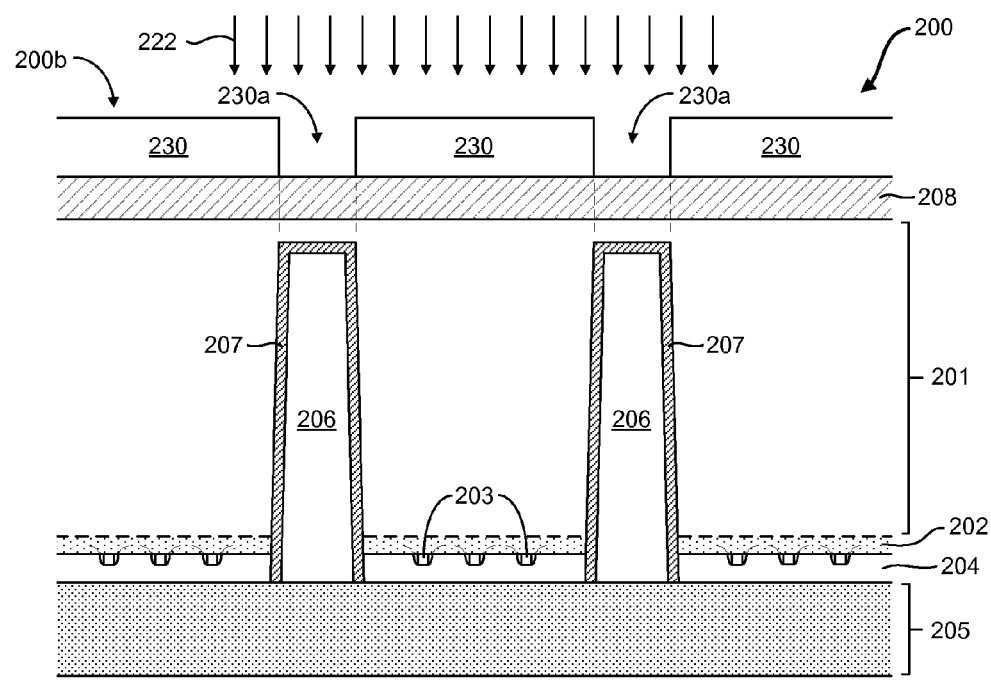

FIG. 2b schematically depicts the wafer 200 of FIG. 2a in a further advanced stage, where an etch mask 230 may be formed above the dielectric protection layer 208. In some illustrative embodiments, the etch mask 230 may be, for example, a photoresist mask. A patterning process may then be performed on the etch mask 230 so as to form openings 230a, which, in certain embodiments, may be substantially aligned with the TSV's 206, as is shown in FIG. 2b. It should be noted that, since the various steps that may typically be used to form and pattern a photoresist mask are well known in the art, they will not be described herein. After the openings 230a have been formed in the etch mask 230, the back side 200b of the wafer 200 may be exposed to an etch process 222 that is designed to expose the material of the TSV's 206. For example, the etch process 222 may be a dry anisotropic etch process, such as an RIE process and the like, based on etch recipes known in the art. Other anisotropic etch processes may also be used.

Figure 2C:
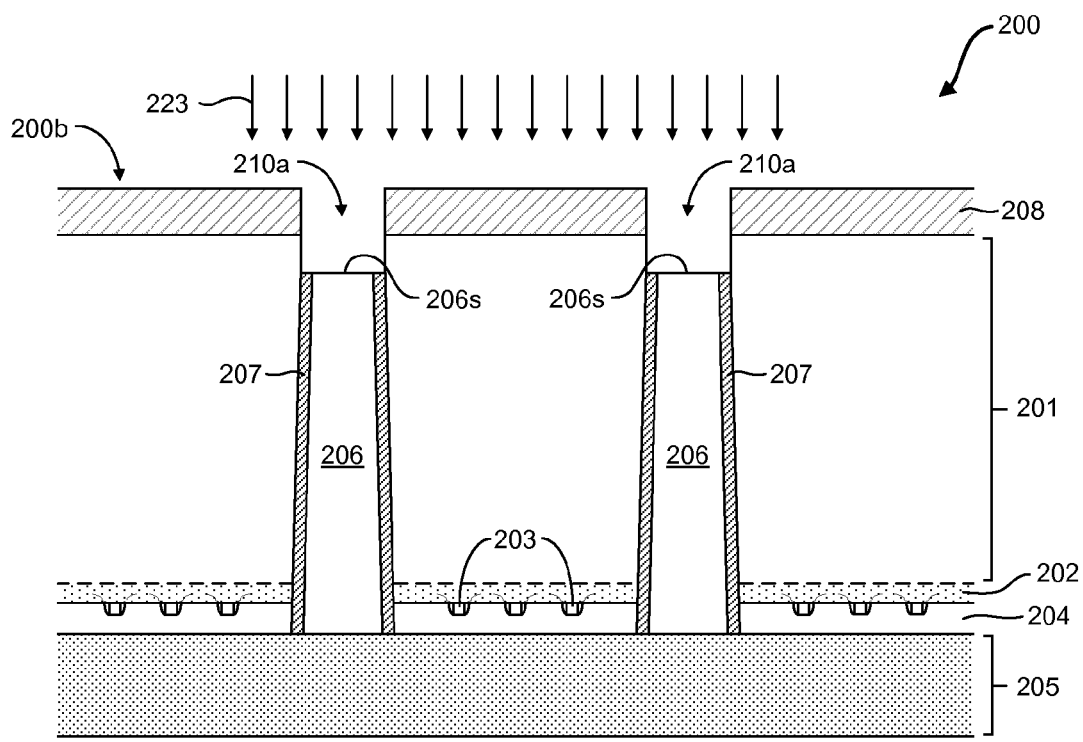

FIG. 2c shows the illustrative wafer 200 of FIG. 2b in a subsequent processing stage, after the openings 230a have been extended to expose the upper surfaces 206s of the TSV's 206. As shown in FIG. 2c, during the etch process 222, via openings 210a may be formed to extend through the dielectric protection layer 208, a portion of the silicon-based semiconductor material of the substrate 201, and the liner 207, stopping at and exposing upper surfaces 206s of the copper-based material of the TSV's 206. After completion of the etch process 222, a post-etch resist strip and clean process is performed to remove the etch mask 230 from above the dielectric protection layer 208. Thereafter, in certain illustrative embodiments, a deposition process 223 is performed so as to form a substantially conformal isolation layer 209 (see, FIG. 2d) above the dielectric protection layer 208, and along the exposed surfaces of the via openings 210a.

In some illustrative embodiments, the isolation layer 209 may act to substantially isolate a remaining portion of the TSV's 206 (see, e.g., the conductive contact plug 210p of FIG. 2f) that will be formed during later processing steps from the material of the substrate 201, as will be described in further detail below. Accordingly, the material of the isolation layer 209 may be any suitable dielectric material, and in certain embodiments may be substantially the same material, and have the substantially same thickness, as that of the liner 207, as described above. Furthermore, the deposition process 223 may be any suitable process that is capable of forming a substantially conformal material layer, such as a CVD process and the like, however it should be appreciated that other deposition processes may also be used, depending on the material of the isolation layer 209, and as may best fit with the overall device integration scheme.

Figure 2D:
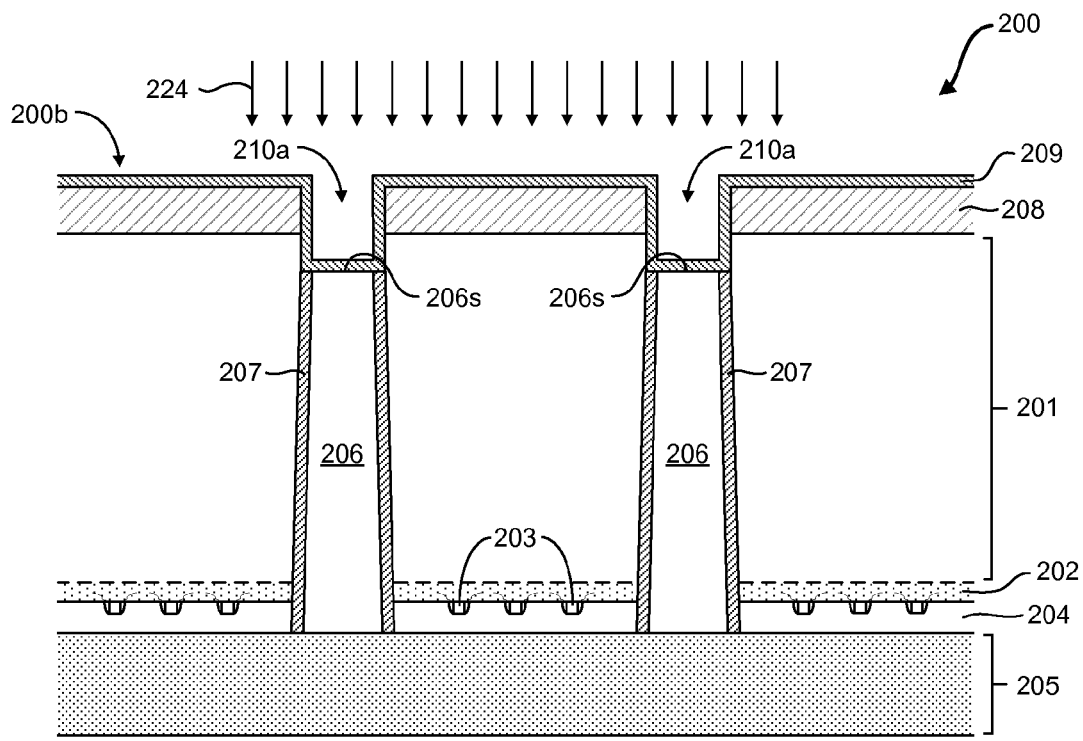

FIG. 2d schematically depicts the wafer 200 after completion of the above-described deposition process 223, where the substantially conformal isolation layer 209 has been formed above the back side 200b of the wafer 200 and along the exposed surfaces of the via openings 210a. In some embodiments, an etch process 224 may then be performed so as to remove the substantially horizontal portion of the isolation layer 209 from above the upper surfaces 206s of the TSV's 206, in preparation for further back side processing. Depending on the overall process flow, the etch process 224 may be a dry anisotropic etch process, such as an RIE process and the like, recipes for which are well known in the art. In at least some embodiments, the etch process 224 may be designed so that the substantially horizontal portions of the isolation layer 209, such as the portion above the upper surfaces 206s of the TSV's 206 are selectively removed, and the substantially vertical portions of the isolation layer 209, such as those portions along the sidewalls 210s of the via openings 210a, remain substantially intact, or with only minimal thickness reduction (see, FIG. 2e). Additionally, in some embodiments, the substantially horizontal portions of the isolation layer 209 above the dielectric protection layer 208 may also be substantially removed during the etch process 224, as shown in FIG. 2e.

Figure 2E:
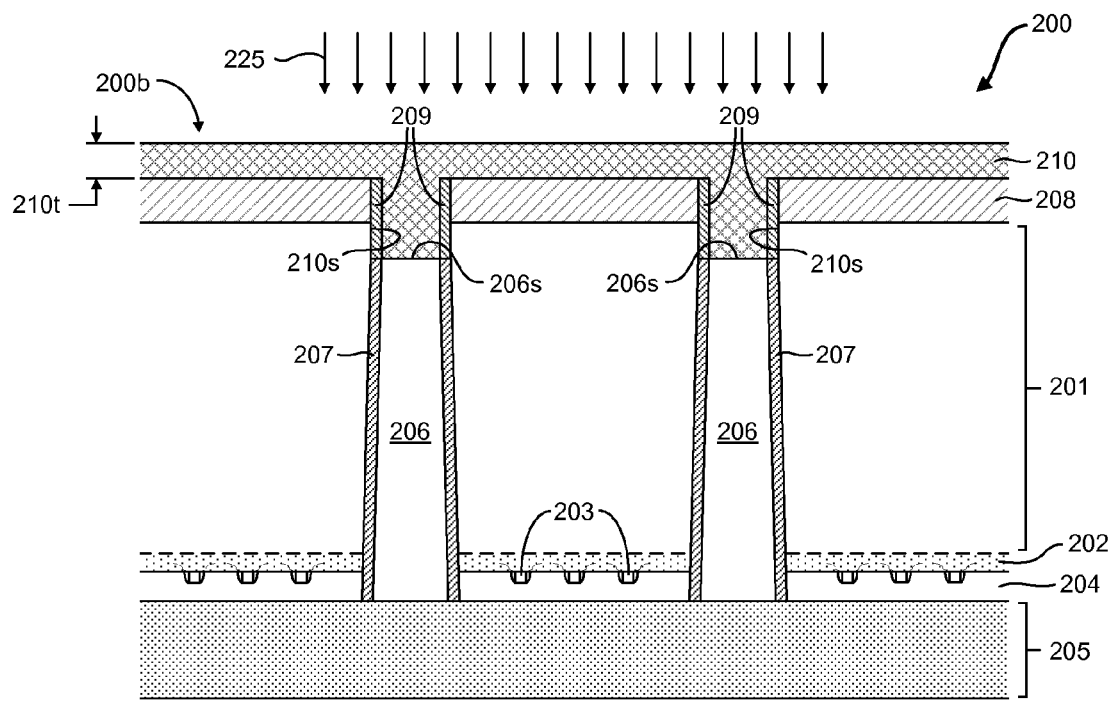

FIG. 2e schematically illustrates the wafer 200 of FIG. 2d after completion of the etch process 224 described above, where, in certain illustrative embodiments, the upper surfaces 206s of the TSV's 206 have been re-exposed, and only the substantially vertical portions of the isolation layer 209 along the sidewalls 210s remain in place. In some embodiments, a deposition process 225 may then be performed so as to form a conductive material layer 210 that substantially fills the via openings 210a. Depending on the device requirements, the conductive material layer 210 may be substantially the same material as that of the through-silicon vias 206, such as copper or a copper-based metal alloy. As shown in FIG. 2e, the conductive material layer 210 may be in electrical contact with the upper surfaces 206s of the TSV's 206, and furthermore may be electrically isolated from the substrate 201 by the substantially vertical portions of the isolation layer 209. The deposition process 225 may be any suitable deposition process that may typically be used to deposit, for example, a copper or copper-based material layer, e.g., an electrochemical deposition process such as electroplating, and the like. In some embodiments, an excess thickness 210t of the conductive material layer 210 may be formed above the dielectric protection layer 208 during the deposition process 225, as shown in FIG. 2e.

Figure 2F:
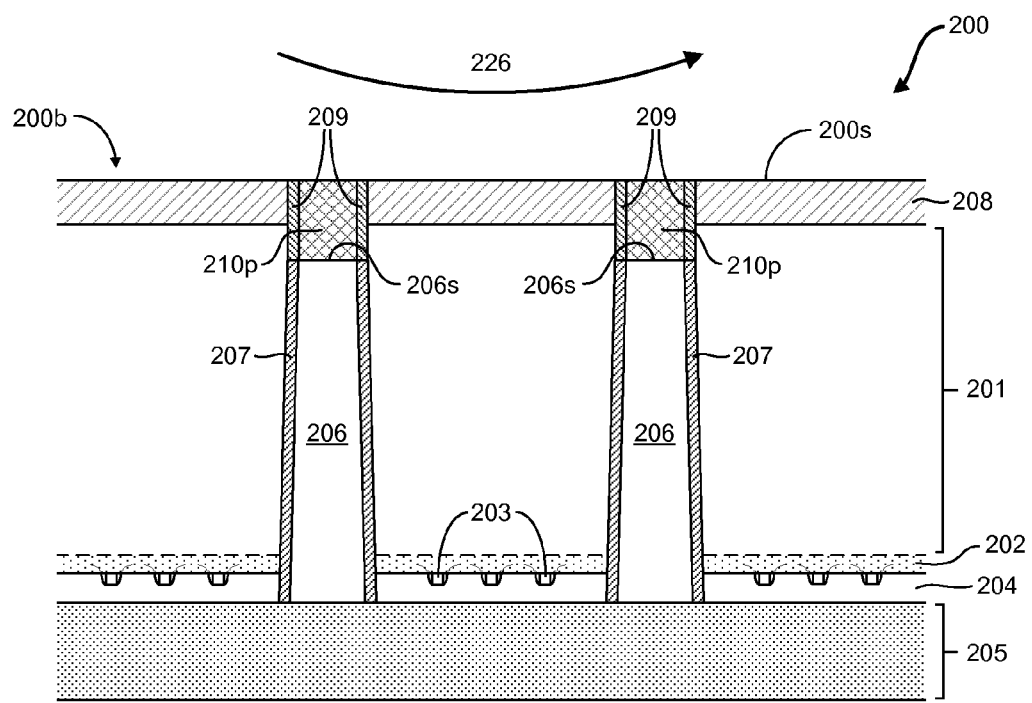

FIG. 2f schematically illustrates the wafer 200 of FIG. 2e in a further advanced processing stage. In certain embodiments, a planarization process 226, such as a CMP process, may be performed to remove the excess thickness 210t of the conductive material layer 210 from above the dielectric protection layer 208, thereby creating a planarized back side surface 200s of the wafer 200. Furthermore, as shown in FIG. 2f, after the planarization process 226 has been completed, conductive contact plugs 210p are formed in the via openings 210a (see, FIGS. 2c-2d), thereby creating a substantially complete and continuous electrical connection between a front side 200f of the wafer 200 and the back side 200b.

In certain embodiments, the dielectric protection layer 208 may act as a CMP stop layer during the planarization process 226. Furthermore, as noted previously, the presence of the dielectric protection layer 208 may also significantly reduce the likelihood that the copper-based material of the conductive material layer 210 may contaminate and diffuse into the silicon-based material of the substrate 201, thereby substantially avoiding the commensurate device degradation.

Figure 2G:
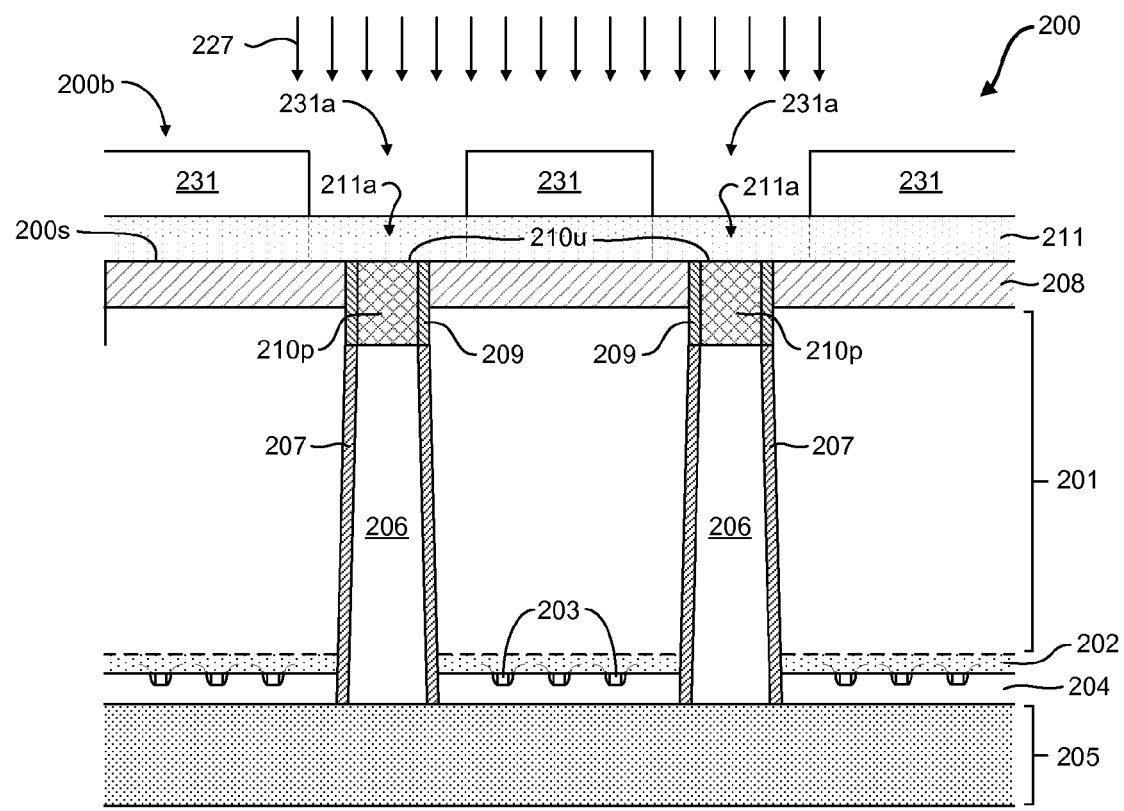

FIG. 2g schematically illustrates the wafer 200 of FIG. 2f in yet a further manufacturing stage, wherein a passivation layer 211 may be formed above the planarized back side surface 200s of the wafer 200. In some illustrative embodiments, and depending on the overall processing requirements, the passivation layer 211 may be a silicon-based dielectric material, such as silicon nitride and the like, or an organic polymer material, such as a polyimide and the like. Thereafter, as shown in FIG. 2g, a second etch mask 231, such as a photoresist mask, may then be formed above the passivation layer 211. The second etch mask 231 may then be patterned to include openings 231a, which, in certain illustrative embodiments, may be formed above the conductive contact plugs 210p. The back side 200b of the wafer 200 may then be exposed to an etch process 227 that is designed to form openings 211a in the passivation layer 211, thereby exposing an upper surface 210u of the contact plugs 210p. In at least some embodiments of the present disclosure, the etch process 227 may be, for example, a dry anisotropic etch process, such as an RIE process and the like, based on any one of the several etch recipes that are well known in the art. Other anisotropic etch processes may also be used.

Figure 2H:
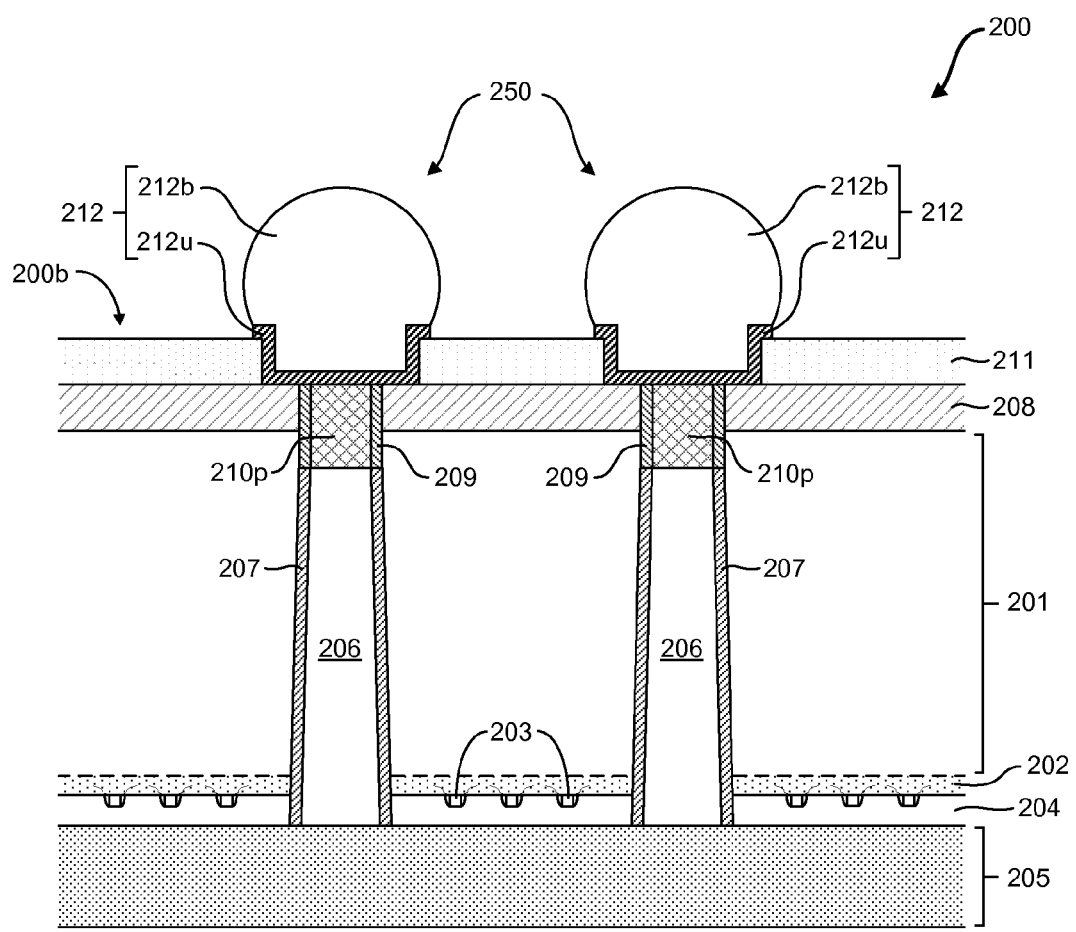

FIG. 2h schematically illustrates the wafer 200 of FIG. 2g in a further advance manufacturing stage, after the passivation layer 211 has been patterned, and a resist strip and clean process has been performed to remove the second patterned etch mask 231. Furthermore, completed interconnect structures 250 have been formed on the back side 200b of the wafer 200, which may be used to affect an electrical connection between the various stacked chips of a representative chip package. Each of the interconnect structures 250 may include, for example, a contact plug 210p that is in electrical contact with a TSV 206, and a bump structure 212 that has been formed in and above the openings 211a (see, FIG. 2g) so as to electrically contact the exposed portions of the upper surfaces 210u (see, FIG. 2g) of the conductive contact plugs 210p. In the illustrative embodiment shown in FIG. 2h, each bump structure 212 may include, for example, a UBM layer 212u and a solder ball 212b. However, it should be appreciated that the illustrative bump structures 212 shown in FIG. 2g are exemplary only, and depending on the device requirements, the bump structures 212 may have other suitable configurations, such as bum pillars, and the like.

FIGS. 3a-3j, which schematically illustrate the various steps in a process flow for performing back side processing of TSV's based on a dual-damascene technique, are described in detail below.

Figure 3A:
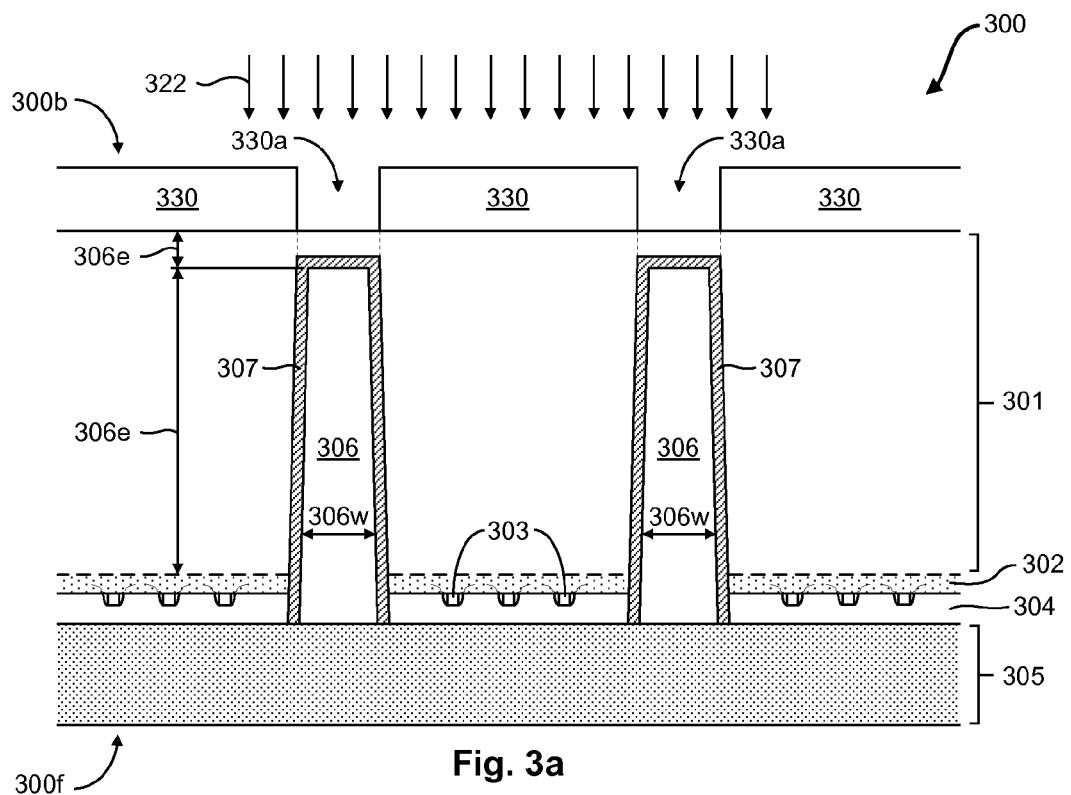
FIGS. 3a-3j schematically illustrate a process flow for performing back side processing of TSV's in accordance with another illustrative embodiment of the present disclosure based on a dual-damascene technique.

FIG. 3a shows a schematic cross-sectional view of an illustrative semiconductor wafer 300 that substantially corresponds to the wafer 100 illustrated in FIG. 1a and described above. As with the wafer 100, the wafer 300 may be made up of a substrate 301, a device layer 302 that may include a plurality of circuit elements 303, a contact structure layer 304, and a metallization system 305. Furthermore, the wafer 300 may also include one or more TSV's 306, which may be electrically isolated and separated from the substrate 301 by a liner 307. In some embodiments, a barrier diffusion layer (not shown) may be formed between the TSV's 306 and the liner 307. Additionally, and depending on the overall processing scheme, the TSV's 306 may extend to a depth 306d into the substrate 301, and come to within a distance 306e of the back side 300b of the wafer 300. It should be noted that, in at least some illustrative embodiments, the materials making up each of the above-listed elements of the wafer 300 illustrated in FIG. 3a may substantially correspond to the materials previously noted with respect to the wafer 100, and therefore will not described here in any further detail.

In some illustrative embodiments of the wafer 300, an etch mask 330, such as, for example, a photoresist mask, may be formed above the substrate 301. As further shown in FIG. 3a, openings 330a may be formed in the etch mask 330, which, in at least some embodiments, may be substantially aligned with the TSV's 306. After the patterned openings 330a have been formed in the etch mask 330, an etch process 322 that is designed to expose the material of the TSV's 306 may be performed. For example, the etch process 322 may be a dry anisotropic etch process, such as an RIE process and the like, based on etch recipes known in the art. Other anisotropic etch processes may also be used.

Figure 3B:
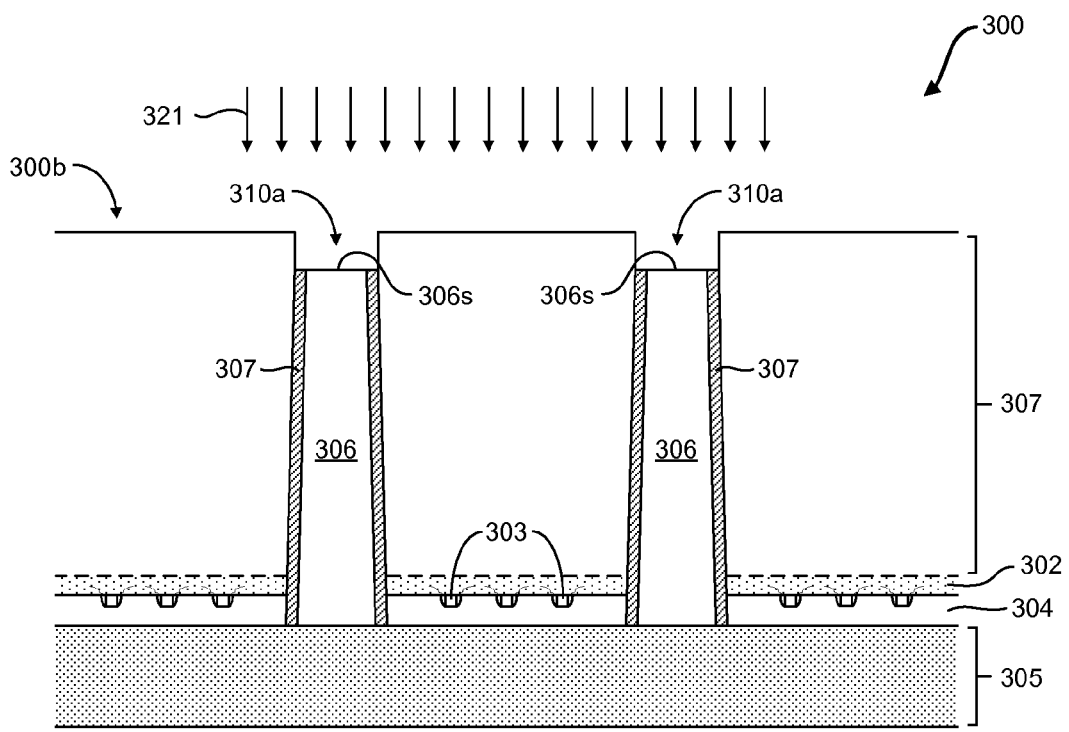

FIG. 3b schematically illustrates the wafer 300 of FIG. 3a in a subsequent processing stage, after the openings 330a in the patterned etch mask 330 have been extended to expose the upper surfaces 306s of the TSV's 306. As shown in FIG. 3b, during the etch process 322, via openings 310a may be formed to extend through a portion of the silicon-based semiconductor material of the substrate 301 and the liner 307, stopping at and exposing upper surfaces 306s of the copper-based material of the TSV's 306. After completion of the etch process 322, a post-etch resist strip and clean process is performed to remove the etch mask 330 from above the substrate 301. Thereafter, in certain illustrative embodiments, a suitably designed deposition process 321, such as a CVD process and the like, may be performed so as form a dielectric protection layer 308 (see, FIG. 3c) above the back side 300b of the wafer 300, and to substantially fill the via openings 310a. Furthermore, as with the dielectric protection layer 208 described with respect to FIGS. 2a-2g above, in some illustrative embodiments, the dielectric protection layer 308 (see, FIG. 3c) may serve to substantially protect the material of the substrate 301 during subsequent back side processing activities, as described below.

Figure 3C:
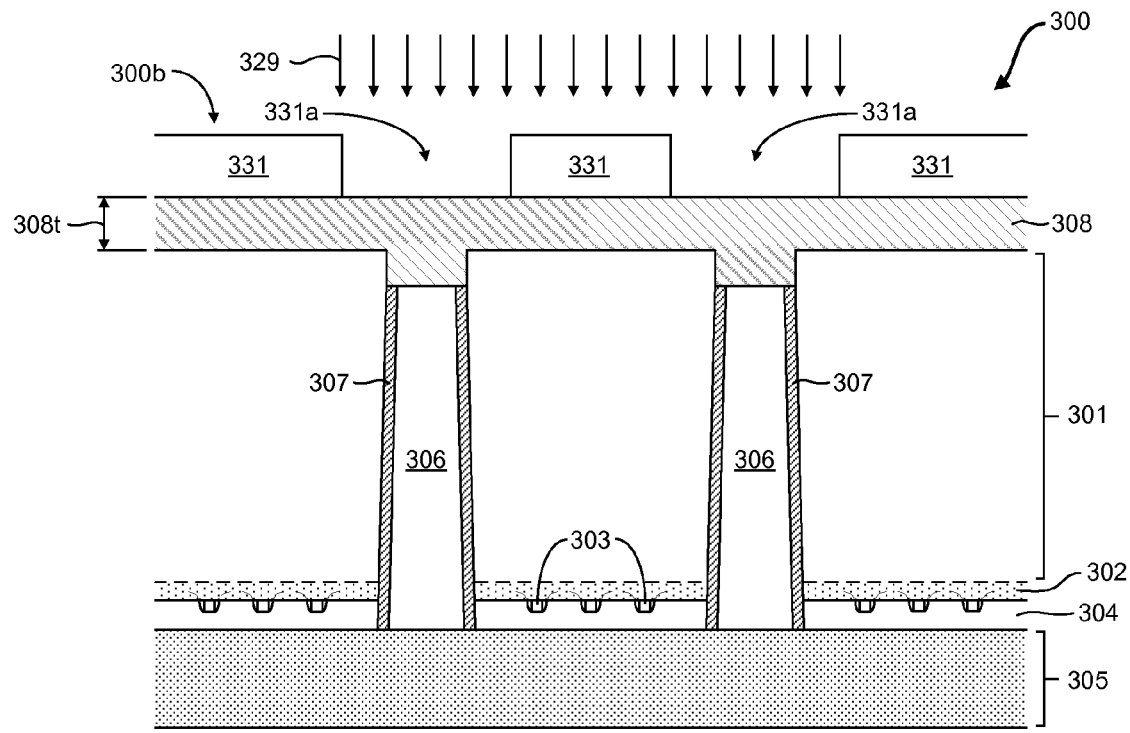

FIG. 3c schematically depicts the wafer 300 of FIG. 3b in an advanced processing stage, wherein the dielectric protection layer 308 has been formed above the substrate 301, and to fill the via openings 310a (see, FIG. 2b). In some illustrative embodiments, the dielectric protection layer 308 may be any one of several suitable dielectric materials, including silicon-based dielectrics such as silicon dioxide, silicon nitride, silicon oxynitride, and the like. Furthermore, the excess thickness 308t of the dielectric protection layer 308 above the substrate 301 may selected as required to withstand the potentially damaging effects of subsequently performed back side processing steps, so as to ensure that the substrate 301 remains substantially protected. For example, in at least some embodiments, the thickness 308*t* of the dielectric protection layer 308 may be between approximately 500-1000 nm, while thicker or even thinner layers may also be used, depending on the ultimate device processing requirements.

Also as shown in FIG. 3*c*, a second etch mask 331, which in certain illustrative embodiments may be a photoresist mask, may then be formed above the dielectric protection layer 308. The second etch mask 331 may be patterned to include openings 331*a*, which, in at least some embodiments, may be formed above and substantially aligned with the previously formed via openings 310*a* (see, FIG. 3*b*). Furthermore, the openings 331*a* may also correspond to trench openings 310*b* (see, FIG. 3*d*), which may be formed in the dielectric protection layer 308 during a suitably designed etch process 329. In at least some embodiments, the etch process 329 may be designed so as to selectively remove the material of the dielectric protection layer 308, relative to the materials of the substrate 301 and the TSV's 306, so that the trench openings 310*b* may be formed, material of the dielectric protection layer 308 may be removed from the previously formed via openings 310*a*, and the upper surfaces 306*s* of the TSV's 306 may be exposed without undue damage to the surrounding structures. For example, in certain embodiments the etch process 329 may be a dry anisotropic etch process, such as an RIE process and the like, based on etch recipes known in the art, as previously described. Other anisotropic etch processes may also be used.

Figure 3D:
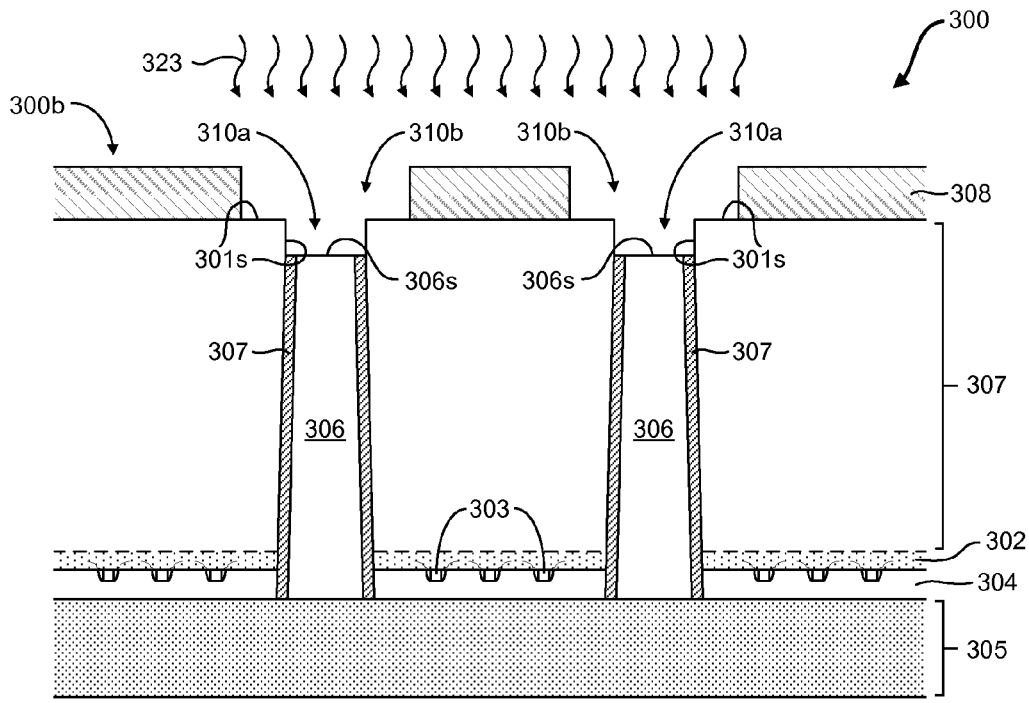

FIG. 3*d* schematically illustrates the wafer 300 of FIG. 3*c* in a further advance manufacturing stage, after the trench openings 310*b* have been formed, the upper surfaces 306*s* of the TSV's 306 have been exposed, and a resist strip and clean process has been performed to remove the second patterned etch mask 331. Thereafter, in some embodiments of the present disclosure, oxide isolation layers 309 (see, FIG. 3*e*)—which, depending on the material of the substrate 301 may be a silicon-based oxide—may be formed on the exposed surfaces 301*s* of the substrate 301. The oxide isolation layers 309 may act to substantially isolate any conductive structures that may be formed in the via openings 310*a* and the trench openings 310*b* during later processing steps from the material of the substrate 301, as will be described in further detail below. Furthermore, TSV oxide layers 306*a* (see, FIG. 3*e*)—which, in certain embodiments may be a copper-based oxide—may also be formed on the upper surfaces 306*s* of the TSV's 306. In at least some illustrative embodiments, the oxide isolation layers 309 and the TSV oxide layers 306*a* may be formed during a common oxidation process 323, such as, for example, a wet furnace oxidation process and the like, although other processes may also be used.

Figure 3E:
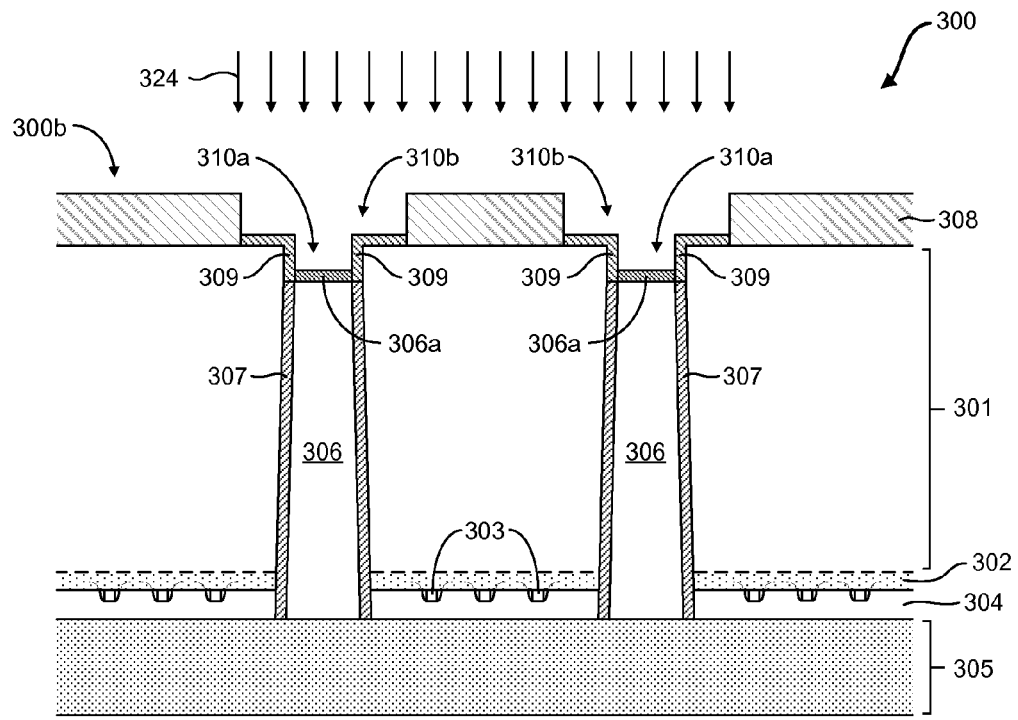

FIG. 3*e* schematically illustrates the wafer 300 of FIG. 3*d* in yet a further manufacture stage. As shown in FIG. 3*e*, the back side 300*b* of the wafer 300 may be exposed to a wet cleaning process 324 so as to selectively remove the TSV oxide layers 306*a* from above the TSV's 306, thus re-exposing the upper surfaces 306*s*. In some illustrative embodiments, the wet cleaning process 324 may be a weak acid isotropic etching process that is designed to substantially remove the TSV oxide layers 306*a*, while not appreciably affecting either the dielectric protection layer 308, the oxide isolation layers 309, or the underlying material of the TSV's 306. For example, the wet cleaning process 324 may be based on a recipe that includes a weak acid, such acetic acid and the like, whereas other recipes may also be used.

Figure 3F:
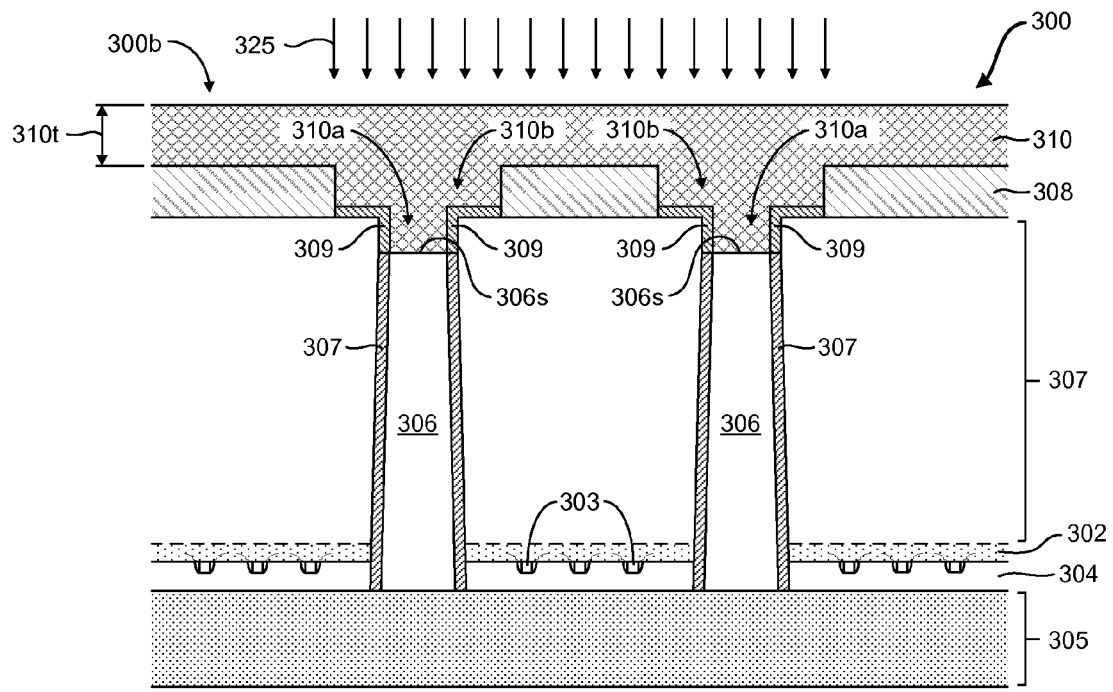

FIG. 3*f* schematically depicts the illustrative wafer 300 of FIG. 3*e* in a subsequent processing stage, after completion of the wet cleaning process 324 described above, and after the upper surfaces 306*s* of the TSV's 306 have been re-exposed.

In some illustrative embodiments, a deposition process 325 may then be performed so as to form a conductive material layer 310 that substantially fills both the via openings 310*a* (see, FIG. 3*e*) formed in the substrate 301, as well as the trench openings 310*b* (see, FIG. 3*e*) formed in the dielectric protection layer 308, in a common deposition step. Depending on the device requirements, the conductive material layer 310 may be substantially the same material as that of the TSV's 306, such as copper or a copper-based metal alloy. As shown in FIG. 3*f*, the conductive material layer 310 may be in electrical contact with the upper surfaces 306*s* of the TSV's 306, and furthermore may be electrically isolated from the surfaces 301*s* of the substrate 301 by the oxide isolation layers 309. It should also be noted that, in certain illustrative embodiments, a barrier isolation layer (not shown) may also be formed on oxide isolation layer 309 so as to substantially prevent diffusion of the copper-based material of the into the silicon-based material of the substrate 301. The deposition process 325 used to form the conductive material layer 310 may be any suitable deposition process as might typically be used to deposit, for example, a copper or copper-based material layer. For example, the deposition process 325 may be an electrochemical deposition process, such as an electroplating process and the like. Furthermore, in certain illustrative embodiments, an excess thickness 310*t* of the conductive material layer 310 may be formed above the dielectric protection layer 308 during the deposition process 325, as shown in FIG. 3*f*.

Figure 3G:
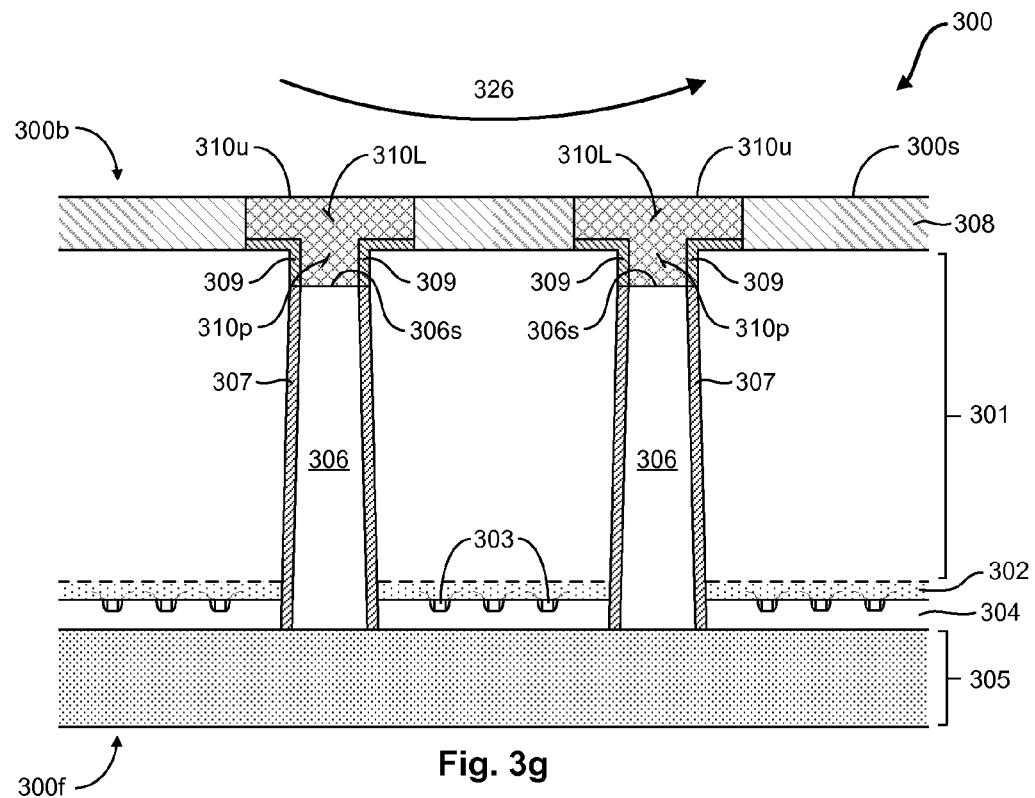

FIG. 3*g* schematically illustrates the wafer 300 of FIG. 3*f* in a further advanced processing stage, wherein a planarization process 326, such as a CMP process and the like, may be performed to remove the excess thickness 310*t* of the conductive material layer 310 from above the dielectric protection layer 308, thereby creating a planarized back side surface 300*s* of the wafer 300. Furthermore, in the illustrative manufacturing stage depicted in FIG. 3*g*, the planarized conductive material layer 310 may now form conductive contact plugs 310*p* in the previously formed via openings 310*a* (see, FIGS. 3*d*-3*f*), as well as conductive lines 310L in the previously formed trench openings 31*b* (see, FIGS. 3*d*-3*f*). Accordingly, a substantially complete and continuous electrical connection has been formed between a front side 300*f* of the wafer 300 and the back side 300*b*.

In certain embodiments, the dielectric protection layer 308 may act as a CMP stop layer during the planarization process 326. Furthermore, as noted previously, the presence of the dielectric protection layer 308 may significantly reduce the likelihood that the copper-based material of the conductive material layer 310 may contaminate and diffuse into the silicon-based material of the substrate 301 during the planarization process 326, thereby substantially avoiding the any corresponding device degradation effects. Moreover, in the illustrative embodiment of FIG. 3*g*, an upper surface 310*u* of the conductive lines 310L is exposed after completion of the CMP process 326.

Figure 3H:
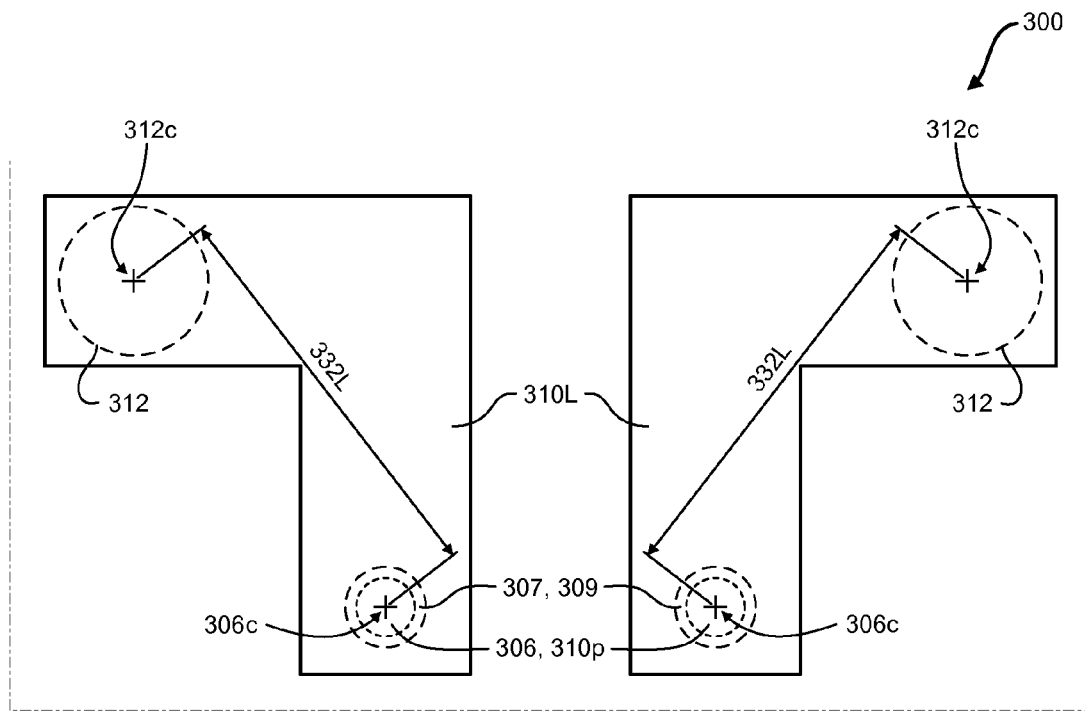

FIG. 3*h* schematically depicts a plan view of one illustrative embodiment of the wafer 300 shown in FIG. 3*g*. As shown in FIG. 3*h*, the conductive lines 310L may be routed from a point 306*c* that substantially coincides with location of a centerline of the TSV's 306 and the conductive contact plugs 310*p*, to a point 312*c* that substantially coincides with the proposed location of a bump structure 312 (see, FIG. 3*j*). In such embodiments, the conductive lines 310L may serve as redistribution lines so that the proposed bump structures 312 may be separated from the TSV's 306 and conductive contact plugs 310*p* by a centerline distance 332L. Accordingly, the proposed bump structure 312 may be positioned above the back side 300b of the wafer 300 at more strategic locations, such as the locations 312c, thereby enabling a bump structure layout that facilitates a more uniform overall back side patterning process, as previously described.

Figure 3I:
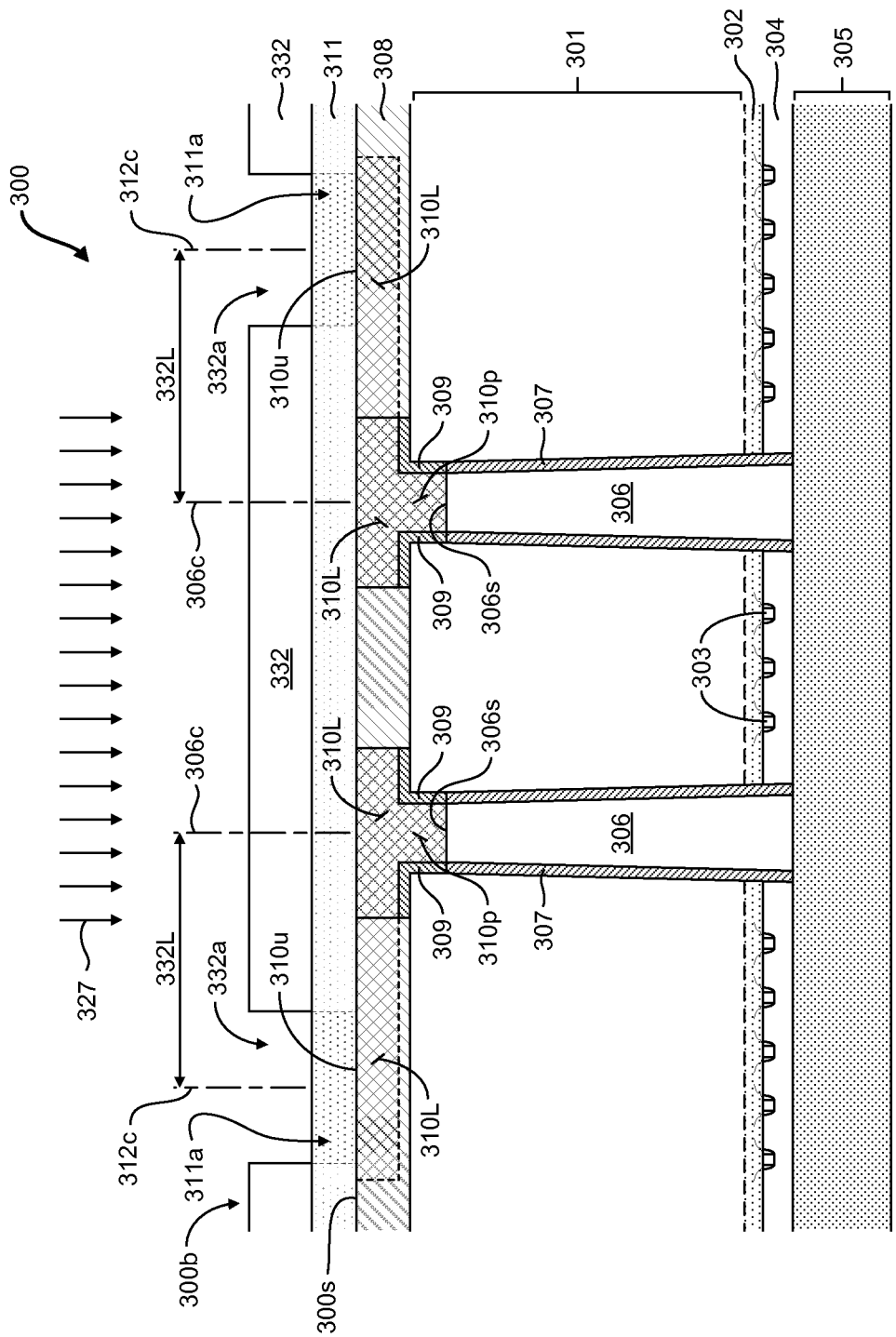

FIG. 3i schematically illustrates the wafer 300 of FIGS. 3g-3h in a further manufacturing stage, wherein a passivation layer 311 may be formed above the planarized back side surface 300s of the wafer 300. In certain illustrative embodiments, the passivation layer 311 may be a silicon-based dielectric material, such as silicon nitride and the like, or an organic polymer material, such as a polyimide and the like. Thereafter, a third etch mask 332, which in at least some embodiments may be a photoresist mask, may then be formed above the passivation layer 311. The third etch mask 332 may then be patterned to include openings 332a, the positions of which may coincide with the location 312c as shown in FIG. 3h—i.e., at the locations of proposed bump structures 312 (see, FIGS. 3h, 3j) that may be formed during later processing steps. For example, in certain illustrative embodiments, the openings 332a may be formed in the third etch mask layer 332 at locations on the back side 300b of the wafer 300 that are remote from the locations of the respective TSV's 306 and conductive contact plugs 310p—e.g., separated by the distance 332L, as shown in FIG. 3h. Furthermore, it should be appreciated that, in those embodiments of the present disclosure wherein the conductive lines 310L may serve as redistribution lines, the respective openings 332a may still be formed above a respective conductive line 310L, thereby maintaining electrical continuity between the TSV's 306 and the bump structures 312 (see, FIG. 3j).

After the third etch mask 332 has been patterned as noted above, the back side 300b of the wafer 300 may then be exposed to an etch process 327 so as to form the openings 311a (indicated by dotted lines in FIG. 3i), thereby exposing an upper surface 310u of the conductive lines 310L. In at least some embodiments, the etch process 327 may be, for example, a dry anisotropic etch process, such as an RIE process and the like as previously described, however it should be understood that other anisotropic etch processes may also be used.

Figure 3J:
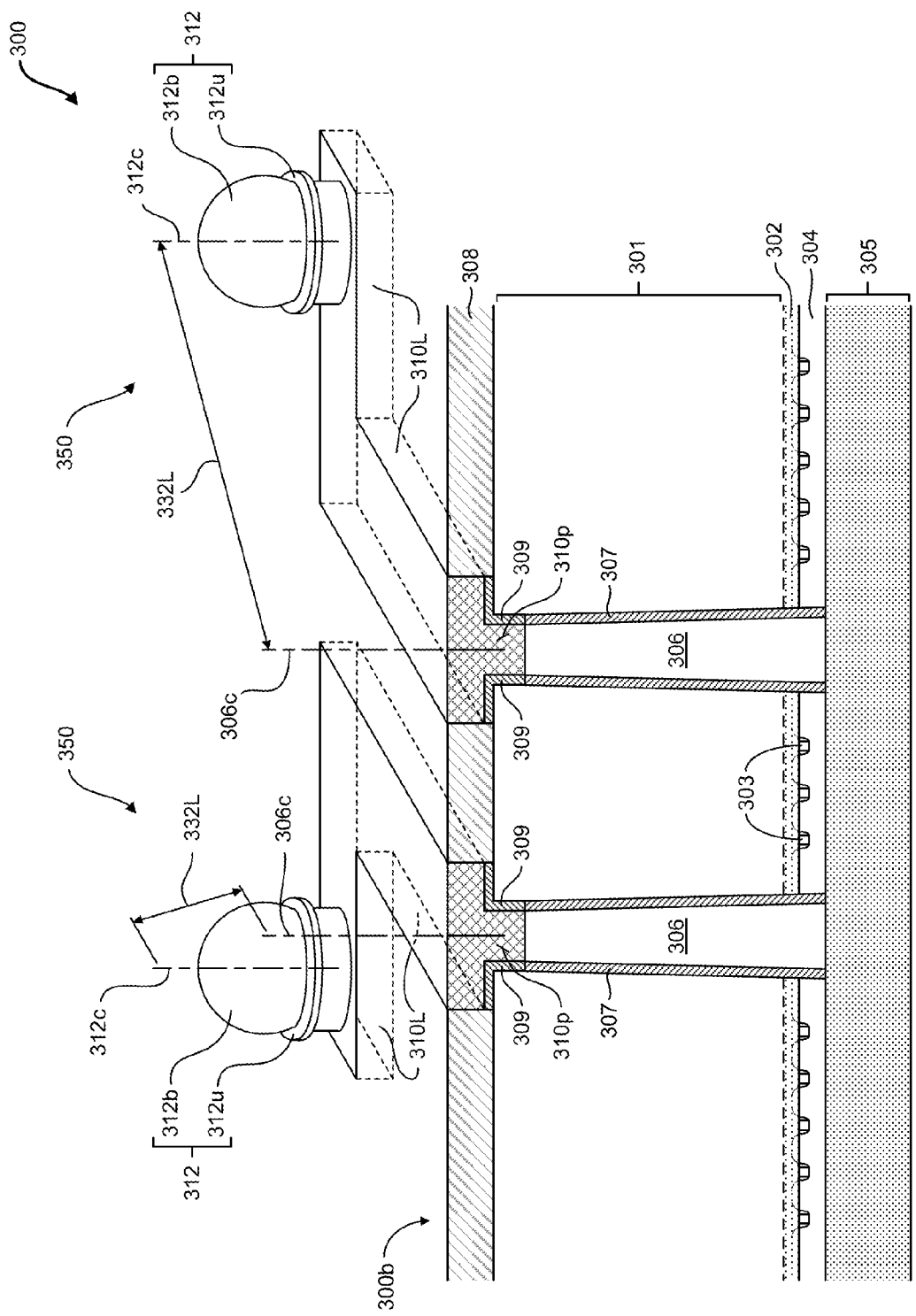

FIG. 3j schematically illustrates the wafer 300 of FIGS. 3i in yet a further advanced processing stage, after the passivation layer 311 (not shown for clarity) has been patterned and the third patterned etch mask 332 has been removed. As shown in FIG. 3j, completed interconnect structures 350 have been formed on the back side 300b of the wafer 300, which, as previously described, may be used to affect an electrical connection between the various stacked chips of a representative chip package. In certain embodiments, each of the interconnect structures 350 may include, for example, a TSV 306 that is in electrical contact with a conductive contact plug 310p that may be integrally formed with a redistribution line—i.e., a conductive line 310L—and a bump structure 312 that has been formed in and above the openings 311a (see, FIG. 3i) so as to electrically contact the exposed portions of the upper surfaces 310u of the conductive lines 310L. Furthermore, as shown in FIG. 3j, the redistribution line—i.e., the conductive line 310L—has been routed from the location 306c of the TSV 306 and conductive contact plug 310p to a strategic location 312c that is a distance 332L away on the back side 300b. In the illustrative embodiment depicted in FIG. 3i, each bump structure 312 may include, for example, a UBM layer 312u and a solder ball 312b, as might generally be part of the interconnect structures that are typically used to effect the electrical connections previously described. However, as noted with respect to the illustrative wafer 200 shown in FIG. 2g and described above, other bump structure configurations, such as bump pillars and the like, may also be used for the embodiments illustrated and described herein.

As a result, the subject matter disclosed herein provides various methods of performing back side processing on through-silicon vias (TSV's), as well as the various structures resulting therefrom. Furthermore, it should be appreciated that the single damascene back side processing flow techniques of the present disclosure may provide advanced interconnect structures that utilize copper and copper-based materials, and which may be superior in many ways to the prior art interconnect structures described above. For example, the disclosed process flows eliminates the need for the aluminum-based contact pads of the prior art interconnect structures and their associated limitations, thereby avoiding the material deposition, photolithography patterning, and etching process steps needed to form the contact pads. Additionally, the copper and/or copper-based metal alloy conductive contact plugs of the advanced interconnect structures disclosed herein may also provide superior thermal and electrical conductivity, and well as superior electromigration resistance, as compared to the aluminum-based contact pads of the prior art interconnect structures. Moreover, it should be further appreciated that the dual damascene back side processing flow techniques disclosed herein may also provide a substantially enhanced degree of flexibility in locating the advanced interconnect structures of the present disclosure, thereby providing superior alternatives to the aluminum-based prior art interconnect structures, which may require significantly more complex processing techniques so as to achieve the same degree of redistribution line routing.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    forming a conductive via element in a semiconductor substrate, wherein said conductive via element is formed from a front side of said semiconductor substrate so as to initially extend a partial distance through said semiconductor substrate;
    forming a dielectric material layer above a back side of said semiconductor substrate;
    forming a via opening in said back side of said semiconductor substrate to expose a surface of said conductive via element;
    forming a layer of conductive contact material above said dielectric material layer, said layer of conductive contact material filling said via opening; and
    performing a planarization process to remove an excess thickness of said layer of conductive contact material formed above said dielectric material layer by using said dielectric material layer as a planarization stop layer.

2. The method of claim 1, further comprising forming an isolation layer in said via opening prior to filling said via opening.

3. The method of claim 2, wherein forming said isolation layer comprises performing a material deposition process.

4. The method of claim 2, wherein forming said isolation layer comprises performing an oxidation process.

5. The method of claim 2, wherein forming said isolation layer comprises forming a portion of said isolation layer above said surface of said conductive via element and removing said portion of said isolation layer prior to filling said via opening.

6. The method of claim 5, wherein forming said isolation layer comprises forming a further portion of said isolation layer above said dielectric material layer and removing said further portion from above said dielectric material layer while removing said portion from above said surface of said conductive via element.

7. The method of claim 1, wherein said dielectric material layer is formed prior to forming said via opening in said back side of said substrate, and wherein forming said via opening comprises forming an opening in said dielectric material layer.

8. The method of claim 1, wherein forming said dielectric material layer comprises filling said via opening, the method further comprising forming a trench opening in said dielectric material layer to expose a surface portion of said back side of said semiconductor substrate and removing said dielectric material layer from said via opening to re-expose said surface of said conductive via element.

9. The method of claim 8, wherein forming said layer of conductive contact material comprises filling said trench opening in a common material deposition process with filling said via opening.

10. The method of claim 9, wherein filling said via opening comprises forming a conductive contact plug and wherein filling said trench opening comprises forming a conductive line.

11. The method of claim 10, further comprising forming a bump structure above said dielectric material layer, wherein said bump structure is separated from said conductive via element by a distance across said back side surface, and wherein forming said conductive line comprises forming a redistribution line that electrically connects said conductive via element to said bump structure.

12. The method of claim 8, wherein forming said trench opening and removing said dielectric material layer from said via opening comprises performing a common etch process.

13. The method of claim 1, wherein filling said via opening comprises performing an electrochemical deposition process.

14. The method of claim 1, wherein filling said via opening with said layer of conductive contact material comprises depositing a material comprising copper.

15. The method of claim 1, further comprising forming a passivation layer above said dielectric material layer after performing said planarization process.

16. A method, comprising:
forming a conductive via element in a semiconductor substrate, wherein said conductive via element is formed from a front side of and extends partially through said semiconductor substrate;
forming a via opening in a back side of said semiconductor substrate, said via opening exposing a surface of said conductive via element;
forming a dielectric protection layer above said back side, said dielectric protection layer filling said via opening;
forming an opening in said dielectric protection layer and above said via opening, wherein forming said opening comprises exposing a surface portion of said back side and removing said dielectric protection layer from said via opening to re-expose said surface of said conductive via element; and
forming an interconnect structure that is electrically connected to said conductive via element, wherein at least a portion of said interconnect structure is formed in said opening.

17. The method of claim 16, wherein forming said interconnect structure comprises forming a conductive contact plug in said semiconductor substrate, wherein said conductive contact plug is in electrical contact with said conductive via element.

18. The method of claim 17, further comprising forming a bump structure above said back side of said semiconductor substrate, wherein said bump structure is electrically connected to said conductive contact plug.

19. The method of claim 18, further comprising forming a redistribution line in said opening, wherein said redistribution line electrically connects said conductive contact plug to said bump structure.

20. The method of claim 19, wherein forming said conductive contact plug and forming said redistribution line comprises performing a common material deposition process.

21. A method of claim 16, further comprising:
forming an isolation layer on said exposed surface portion of said back side of said semiconductor substrate, sidewall surfaces of said via opening, and said exposed surface of said conductive via element; and
selectively removing said isolation layer from said surface of said conductive via element.

22. A method of claim 21, wherein forming said isolation layer comprises performing an oxidation process.

23. A method, comprising:
forming a via opening in a back side of a semiconductor substrate, said via opening exposing a surface of a conductive via element that initially extends a partial distance through said semiconductor substrate from a front side thereof;
forming a conductive contact plug in said via opening, wherein said conductive contact plug is electrically connected to said conductive via element;
forming a dielectric protection layer above said back side;
forming a trench opening in said dielectric protection layer and above said via opening;
forming a conductive material comprising copper above said dielectric protection layer, said conductive material filling at least said trench opening; and
forming a metal line in said trench opening by performing a planarization process to remove a portion of said conductive material formed above said dielectric protection layer using said dielectric protection layer as a planarization stop.

24. The method of claim 23, wherein said conductive contact plug is formed in electrical contact with said conductive via element.

25. The method of claim 23, wherein forming said conductive contact plug and forming said metal line comprises depositing said conductive material comprising copper in said via opening and in said trench opening in a common material deposition process.

26. The method of claim 25, wherein forming said trench opening comprises exposing a portion of said back side of said semiconductor substrate.

27. The method of claim 26, further comprising forming an isolation layer at least on sidewall surfaces of said via opening and on bottom surfaces of said trench opening prior to depositing said conductive material.

28. The method of claim 27, wherein forming said isolation layer comprises oxidizing exposed surfaces of said semiconductor substrate.

29. A method, comprising:

forming a conductive via element in a semiconductor substrate, wherein said conductive via element is formed from a front side of said semiconductor substrate so as to initially extend a partial distance through said semiconductor substrate;

forming a dielectric material layer above a back side of said semiconductor substrate;

forming a via opening in said dielectric material layer, said via opening extending into said back side of said semiconductor substrate to expose a surface of said conductive via element;

forming an isolation layer above said back side, said isolation layer covering said dielectric material layer, sidewalls of said via opening, and said exposed surface of said conductive via element;

removing horizontal portions of said isolation layer from above said dielectric material and said exposed surface of said conductive via element while maintaining vertical portions of said isolation layer covering said sidewalls; and forming a conductive contact plug in said via opening.

30. A method of claim 29, wherein forming said isolation layer comprises performing a conformal deposition process.

31. A method of claim 29, wherein forming said conductive contact plug comprises forming a conductive material comprising copper above said dielectric material layer and performing a planarization process using said dielectric material layer as a planarization stop.

32. A method of claim 31, further comprising forming a passivation layer above said planarized dielectric material layer and conductive contact plug, forming an opening in said passivation layer to expose an upper surface of said conductive contact plug, and forming a conductive structure in said opening, said conductive structure being in electrical contact with said upper surface of said conductive contact plug.

* * * * *